US008504342B2

(12) United States Patent
Bailey et al.

(10) Patent No.: US 8,504,342 B2
(45) Date of Patent: Aug. 6, 2013

(54) MODELING AND DESIGNING OF WELL DRILLING SYSTEM THAT ACCOUNTS FOR VIBRATIONS

(75) Inventors: Jeffrey R. Bailey, Houston, TX (US); Erika A. O. Biediger, Houston, TX (US); Vishwas Gupta, Sugar Land, TX (US)

(73) Assignee: ExxonMobil Upstream Research Company, Houston, TX (US)

( * ) Notice: Subject to any disclaimer, the term of this patent is extended or adjusted under 35 U.S.C. 154(b) by 300 days.

(21) Appl. No.: 12/517,526

(22) PCT Filed: Dec. 6, 2007

(86) PCT No.: PCT/US2007/025017
§ 371 (c)(1),
(2), (4) Date: Jun. 3, 2009

(87) PCT Pub. No.: WO2008/097303
PCT Pub. Date: Aug. 14, 2008

(65) Prior Publication Data
US 2010/0032165 A1    Feb. 11, 2010

Related U.S. Application Data

(60) Provisional application No. 60/899,305, filed on Feb. 2, 2007.

(51) Int. Cl.
*G06G 7/48* (2006.01)
*E21B 43/00* (2006.01)

(52) U.S. Cl.
USPC .................................. 703/10; 703/7; 166/369

(58) Field of Classification Search
USPC ................................. 703/7, 10, 2, 1; 166/369
See application file for complete search history.

(56) References Cited

U.S. PATENT DOCUMENTS

| | | | |
|---|---|---|---|
| 4,903,245 A | 2/1990 | Close et al. | |
| 5,159,577 A | 10/1992 | Twist | |
| 5,313,829 A | 5/1994 | Paslay et al. | |
| 5,321,981 A | 6/1994 | Macpherson | |
| 5,358,059 A | 10/1994 | Ho | |

(Continued)

OTHER PUBLICATIONS

Williams, J.B. et al., "An Analysis of Predicted Wellbore Trajectory Using a Three-Dimensional Model of a Bottomhole Assembly with Bent Sub, Bent Housing, and Eccentric Contact Capabilities", Oct. 8-11, 1989, 64th Annual Technical Conference and Exhibition of the Society of Petroleum Engineers, SPE.*

(Continued)

*Primary Examiner* — David Silver
*Assistant Examiner* — Cedric D Johnson
(74) *Attorney, Agent, or Firm* — ExxonMobil Upstream Research Company—Law Department

(57) ABSTRACT

A method and apparatus associated with the production of hydrocarbons is disclosed. The method, which relates to modeling of drilling equipment, includes constructing one or more design configurations for at least a portion of a bottom hole assembly (BHA) and calculating results from each of the one or more design configurations. The calculated results of the modeling may include one or more performance indices that characterize the BHA vibration performance of the design configurations for operating parameters and boundary conditions that are substantially the same or may be different. These results are then simultaneously displayed for a user to facilitate design selection. The selected BHA design configuration may then be utilized in a well construction operation and thus associated with the production of hydrocarbons.

60 Claims, 16 Drawing Sheets

U.S. PATENT DOCUMENTS

| | | | |
|---|---|---|---|
| 5,402,677 A | 4/1995 | Paslay et al. | |
| 5,560,439 A | 10/1996 | Delwiche et al. | |
| 5,842,149 A | 11/1998 | Harrell et al. | |
| 5,844,132 A | 12/1998 | Fabret et al. | |
| 6,021,377 A | 2/2000 | Dubinsky et al. | |
| 6,206,108 B1* | 3/2001 | MacDonald et al. | 175/24 |
| 6,438,495 B1 | 8/2002 | Chau et al. | |
| 6,443,242 B1 | 9/2002 | Newman et al. | |
| 6,467,557 B1 | 10/2002 | Krueger et al. | |
| 6,603,472 B2 | 8/2003 | Allen et al. | |
| 6,654,691 B2* | 11/2003 | Metrick | 702/6 |
| 6,662,110 B1 | 12/2003 | Bargach et al. | |
| 6,691,802 B2 | 2/2004 | Schultz et al. | |
| 6,732,052 B2 | 5/2004 | MacDonald et al. | |
| 6,785,641 B1 | 8/2004 | Huang | |
| 6,817,425 B2 | 11/2004 | Schultz et al. | |
| 6,968,909 B2 | 11/2005 | Aldred et al. | |
| 7,020,597 B2 | 3/2006 | Oliver et al. | |
| 7,054,750 B2 | 5/2006 | Rodney et al. | |
| 7,082,371 B2 | 7/2006 | Griffin et al. | |
| 7,139,689 B2 | 11/2006 | Huang | |
| 7,219,747 B2 | 5/2007 | Gleitman et al. | |
| 7,251,590 B2 | 7/2007 | Huang et al. | |
| 7,413,032 B2 | 8/2008 | Krueger | |
| 7,464,013 B2 | 12/2008 | Huang et al. | |
| 2002/0074166 A1* | 6/2002 | Chavez et al. | 175/66 |
| 2004/0211596 A1 | 10/2004 | Huang | |
| 2004/0221985 A1* | 11/2004 | Hill et al. | 166/250.01 |
| 2004/0256152 A1 | 12/2004 | Dashevskiy et al. | |
| 2005/0075791 A1* | 4/2005 | Lailly et al. | 702/17 |
| 2005/0096847 A1 | 5/2005 | Huang | |
| 2005/0133272 A1 | 6/2005 | Huang et al. | |
| 2005/0194183 A1* | 9/2005 | Gleitman et al. | 175/45 |
| 2005/0197813 A1 | 9/2005 | Grayson | |
| 2005/0273304 A1 | 12/2005 | Oliver et al. | |
| 2005/0279532 A1 | 12/2005 | Ballantyne et al. | |
| 2006/0032674 A1* | 2/2006 | Chen et al. | 175/372 |
| 2006/0149518 A1 | 7/2006 | Oliver et al. | |
| 2006/0195307 A1 | 8/2006 | Huang et al. | |
| 2007/0005316 A1 | 1/2007 | Paez | |
| 2007/0021857 A1* | 1/2007 | Huang | 700/117 |
| 2007/0032958 A1* | 2/2007 | Chen | 702/14 |
| 2007/0067147 A1 | 3/2007 | Huang | |
| 2007/0289778 A1 | 12/2007 | Watkins et al. | |
| 2008/0164062 A1 | 7/2008 | Brackin et al. | |

OTHER PUBLICATIONS

Serrarens, A.F., "H Control as Applied to Torsional Drillstring Dynamics", Master Thesis, Mar. 1997, Shell International Exploration and Production (SIEP), pp. (v, 9, 10, 31, 37, 38).*

Abdulgalil, F. et al., "Nonlinear Control Design for Suppressing Stick-Slip Oscillations in Oil Well Drillstrings", 2004 5th Asian Control Conference.*

Li, Zifeng et al., "Mathematical Models for Analysis of Bottom Hole Assembly", 1999, Society of Petroleum Engineers.*

Dykstra, M.W. et al., "Drillstring Component Mass Imbalance: A Major Source of Downhole Vibrations", SPE 29350, Feb. 28-Mar. 2, 1995, pp. 234-241, 1995 SPE/IADC Drilling Conf., Amsterdam, The Netherlands.

Dykstra, M.W. et al., "Improving Drilling Performance by Applying Advanced Dynamics Models", SPE 67697, Feb. 27-Mar. 1, 2001, pp. 1-18, SPE/IADC Drilling Conf., Amsterdam, The Netherlands.

Field, D.J. et al., "Techniques for Successful Application of Dynamic Analysis in the Prevention of Field-Induced Vibration Damage in MWD Tools", SPE 25773, Feb. 23-25, 1993, pp. 901-913, SPE/IADC Drilling Conf., Amsterdam, The Netherlands.

Fear, M.J. et al., "Experience in the Detection and Suppression of Torsional Vibration From Mud Logging Data", SPE 28908, Oct. 25-27, 1994, pp. 433-448, 1997 European Petroleum Conf., London, U.K.

Fear, M.J. et al., "The Destruction of PDC Bits by Severe Slip-Stick Vibration", SPE 37639, Mar. 4-6, 1997, pp. 1-11, SPE/IADC Drilling Conf., Amsterdam, The Netherlands.

Fontenot, E.P., "Drilling a 26-in. Diameter Hole to 12,550 ft: A Case History", SPE 15365, Oct. 5-8, 1986, pp. 1-12, 61st Annual Technical Conf. and Exh. of the Society of Petroleum Engineers, New Orleans, LA.

Gallagher, J. et al., "Performance Drilling: A Practical Solution to Drillstring Vibration", SPE 27538, Feb. 15-18, 1994, pp. 961-970, IADC/SPE Drilling Conf., Dallas, TX.

Grindhaug, G. et al., "Planning and Detailed BHA Vibration Modeling Leads to Performance Step Change Drilling Deviated 24-in. Hole Section, Offshore Norway", SPE 99126, Feb. 21-23, 2006, pp. 1-12, IADC/SPE Drilling Conf., Miami, FL.

Halsey, G.W. et al., "Drillstring Torsional Vibrations: Comparison Between Theory and Experiment on a Full-Scale Research Drilling Rig", SPE 15564, Oct. 5-8, 1986, pp. 1-10, 61st Annual Technical Conf. and Exh. of the Society of Petroleum Engineers, New Orleans, LA.

Hanson, J.M. et al., "Dynamics Modeling of PC Bits", SPE 29401, Feb. 28-Mar. 2, 1995, pp. 589-604, SPE/IADC Drilling Conf., Amsterdam, The Netherlands.

Heisig, G. et al., "Lateral Drillstring Vibrations in Extended-Reach Wells", SPE 59235, Feb. 23-25, 2000, pp. 1-11, 2000 IADC/SPE Drilling Conf., New Orleans, LA.

Henneuse, H., "Surface Detection of Vibrations and Drilling Optimization: Field Experience", SPE 23888, Feb. 18-21, 1992, pp. 409-423, 1992 IADC/SPE Drilling Conf., New Orleans, LA.

Howard, J.A. et al., "Systematic Tracking of Fatigue and Crack Growth to Optimize Drillstring Reliability", SPE 25775, Feb. 23-25, 1993, pp. 927-939, 1993 SPE/IADC Drilling Conf., Amsterdam, The Netherlands.

Jansen, J.D., "Whirl and Chaotic Motion of Stabilized Drill Collars", SPE 20930, Oct. 22-24, 1990, pp. 107-114, 1990 European Petroleum Conf., The Hague.

Jansen, J.D. et al., "Active Damping of Torsional Drillstring Vibrations with a Hydraulic Top Drive", SPE 28911, Oct. 25-27, 1994, pp. 250-254, 1994 European Petroleum Conf., London, England.

Javanmardi, K. et al., "Application of Soft-Torque Rotary Table in Mobile Bay", SPE 23913, Feb. 18-21, 1992, pp. 645-650, 1992 IADC/SPE Drilling Conf., New Orleans, LA.

Jogi, P. et al., 'Visualization of BHA Dynamics Improves Understanding of Downhole Drilling Conditions, SPE 99181, Feb. 21-23, 2006, pp. 1-10, IADC/SPE Drilling Conf., Miami, FL.

Kenner J.V. et al., "Dynamic Analysis Reveals Stability of Roller Cone Rock Bits", SPE 28314, Sep. 25-28, 1994, pp. 227-236, SPE 69th Annual Technical Conf. and Exh.

Chen, David C.K. et al., "Maximizing Drilling Performance with State-of-the-Art BHA Program", SPE 104502, Feb. 20-22, 2007, pp. 1-13, 2007 SPE/IADC Drilling Conf., Amsterdam, The Netherlands.

Chen, S.L., et al., "Field Investigation of the Effects of Stick-Slip, Lateral, and Whirl Vibrations on Roller Cone Bit Performance", SPE 56439, Oct. 3-6, 1999, pp. 1-10, 1999 SPE Annual Technical Conf. and Exh., Houston, TX.

Chin, W.C., "Predicting and Avoiding Catastrophic Drillstring Failure", SPE 19445, Aug. 17, 1989, pp. 1-12, SPE Publications.

Clayer, F. et al., "The Effect of Surface and Downhole Boundary Conditions on the Vibration of Drillstrings", Sep. 23-26, 1990, SPE 20447, pp. 431-442, 65th Annual Technical Conf. and Exh. of the Society of Petroleum Engineers, New Orleans, LA.

Clayton, R.I. et al., "Development of Whirl Resistant PDC Bits", SPE 26954, Apr. 27-29, 1994, pp. 625-637, III Latin American/Caribbean Petroleum Engineering Conf., Buenos Aires, Argentina.

Close, D.A. et al., "Measurement of BHA Vibration Using MWD", SPE 17273, Feb. 26-Mar. 2, 1988, pp. 659-668, 1988 IADC/SPE Drilling Conf., Dallas, TX.

Cobern, M.E. et al., "Downhole Vibration Monitoring & Control System Quarterly Technical Report #2", Apr. 1, 2003, pp. 3-19, DOE Award No. DE-FC26-02NT41664, OSTI ID: 821466, APS Technology Inc.

Cook, R.L. et al., "First Real Time Measurements of Downhole Vibrations, Forces, and Pressures Used to Monitor Directional Drilling Operations", SPE 18651, Feb. 28-Mar. 3, 1989, 1989 SPE/IADC Drilling Conf., New Orleans, LA.

Cutt, R.N. et al., "Beryl Field: Extracting Maximum Value from a Mature Asset Through the Evolution of Technology", SPE 92763, Feb. 23-25, 2005, pp. 1-9, SPE/IADC Drilling Conf., Amsterdam, The Netherlands.

Dareing, D.W., "Longitudinal and Angular Drill-String Vibrations with Damping", Sept, 22-25, 1968, pp. 1-9, Ref. B-C, Paper No. 68-Pet-30, Petroleum Mechanical Engineering and First Pressure Vessel and Piping Conf., Dallas, TX.

Dareing, D.W., "Drill Collar Length is a Major Factor in Vibration Control", SPE 11228, Sep. 26-29, 1983, pp. 637-644, 1982 SPE Annual Tech. Conf. & Exh., New Orleans, LA.

Dashevskiy, D. et al., "Application of Neural Networks for Predictive Control in Drilling Dynamics", SPE 56442, Oct. 3-6, 1999 pp. 1-8, 1999 SPE Annual Technical Conf. and Exh., Houston, TX.

Dawson, R. et al., "Drillstring Stick-Slip Oscillations", Jun. 14-18, 1987, pp. 1-6, 1987 SEM Spring Conf., Houston TX.

Desmette, S. et al., "Isubs: A New Generation of Autonomous Instrumented Downhole Tool", SPE 92424, Feb. 23-25, 2005, pp. 1-7, SPEC/IADC Drilling Conf., Amsterdam, The Netherlands.

Dufeyte, M.P. et al., "Detection and Monitoring of the Slip-Stick Motion: Field Experiments", SPE 21945, Mar. 11-14, 1991, pp. 429-438, 1991 SPE/IADC Drilling Conf., Amsterdam, The Netherlands.

Dunayevsky, V.A. et al., "Dynamic Stability of Drillstrings Under Fluctuating Weight on Bit", SPE 14329, Sep. 22-23, 1985, pp. 84-92, 1985 SPE Annual Tech. Conf. & Exh., Las Vegas, NV.

Dupriest, F.E. et al., "Maximizing Drill Rates with Real-Time Surveillance of Mechanical Specific Energy", SPE 92194, Feb. 23-25, 2005, pp. 1-11, SPE/IADC Drilling Conf., Amsterdam, The Netherlands.

Dykstra, M.W., et al., "Experimental Evaluations of Drill Bit and Drill String Dynamics", SPE 28323, Sep. 25-28, 1994, pp. 319-334, $69^{th}$ Annual Technical Conf. and Exh. of the Society of Petroleum Engineers, New Orleans, LA.

Kreisle, L.F. et al., "Mathematical Analysis of the Effect of a Shock Sub on the Longitudinal Vibrations of an Oilwell Drill String", SPE 2778, Dec. 1970, pp. 349-356, SPE Journal, v 10.

Kriesels, P.C. et al., "Cost Savings through an Integrated Approach to Drillstring Vibration Control", SPE 57555, Nov. 8-10, 1999, pp. 1-12, 1999 SPE/IADC Middle East Drilling Technology Conf.

Kyllingstad, A. et al., "A Study of Slip/Stick Motion of the Bit", SPE 16659, Sep. 27-30, 1987, pp. 369-373, 1987 SPE Annual Tech. Conf. & Exh., Dallas, TX.

Leine, R.I. et al., "Stick-Slip Whirl Interaction in Drillstring Dynamics", Apr. 2002, pp. 209-220, Journal of Vibration and Acoustics, v 124.

Li, C., "An Analytical Study of Drill String Vibrations", SPE 15975, 1987, pp. 1-20, Society of Petroleum Engineers.

McCain, J.R, W.D. et al., "The Coefficient of Isothermal Compressibility of Black Oils at Pressures Below the Bubblepoint", SPE 15664, Sep. 1988, pp. 659-662, SPE Formation Evaluation.

Macpherson, J.D. et al., "Surface Measurement and Analysis of Drillstring Vibrations While Drilling", SPE 25777, Feb. 23-25, 1993, pp. 953-963, 1993 SPE/IADC Drilling Conf., Amsterdam, The Netherlands.

Millheim, K.K. et al., "The Effect of Bottomhole Assembly Dynamics on the Trajectory of a Bit", SPE 9222, Sep. 21-24, 1980, pp. 2323-2338, SPE $55^{th}$ Annual Tech. Conf. & Exhibition, Dallas, TX.

Mitchell, R.F. et al., "Case Studies of BHA Vibration Failure", SPE 16675, Sep. 27-30, 1987, pp. 237-250, $62^{nd}$ Annual Technical Conf. and Exh. of the Society of Petroleum Engineers, Dallas, TX.

Murray, P.J. et al., "Slimhole Vibration Case Study", SPE 28325, Sep. 25-28, 1994, pp. 347-356, SPE $69^{th}$ Annual Technical Conf. and Exh., New Orleans, LA.

Neubert, M. et al., "Verification of an Advanced Analysis Model with Downhole Bending Moment Measurements", SPE 93864, Apr. 5-7, 2005, 2005 Asia Pacific Oil & Gas Conf. & Exh., Jakarta, Indonesia.

Nicholson, J.W., "An integrated Approach to Drilling Dynamics Planning, Identification, and Control", SPE 27537, Feb. 15-18, 1994, pp. 947-960, IADC/SPE Drilling Conf., Dallas, TX.

Parfitt, S.H.L. et al., "A Model for Shock Sub Performance Qualification", SPE 29354, Feb. 28-Mar. 2, 1995, pp. 215-225, 1995 SPE/IADC Drilling Conf., Amsterdam, The Netherlands.

Paslay, P.R., "Drill String Vibrations due to Intermittent Contact of Bit Teeth," 1962, pp. 1-8, Transactions of the ASME, Paper No. 62-Pet-13.

Pavone, D.R. et al., "Application of High Sampling Rate Downhole Measurements for Analysis and Cure of Stick-Slip in Drilling", SPE 28324, Sep. 25-28, 1994, pp. 335-345, SPE $69^{th}$ Annual Technical Conf. and Exh., New Orleans, LA.

Perreau, P.J. et al., "New Results in Real Time Vibrations Prediction", SPE 49479, Oct. 11-14, 1998, pp. 190-200, $8^{th}$ Abu Dhabi International Petroleum Exh. and Conf., Abu Dhabi, U.A.E.

Rajnauth, J. et al., "Reduce Torsional Vibration and Improve Drilling Operations", SPE 81174, Apr. 27-30, 2003, pp. 1-13, SPE Latin American and Caribbean Petroleum Engineering Conf., Port-of-Spain, Trinidad, West Indies.

Reid, D. et al., "Analysis of Drillstring Failure", SPE 29351, Feb. 28-Mar. 2, 1995, pp. 187-196, 1995 SPE/IADC Drilling Conf., Amsterdam, The Netherlands.

Warren, T.M. et al., "Torsional Resonance of Drill Collars with PDC Bits in Hard Rock", SPE 49204, Sep. 27-30, 1998, pp. 625-637, 1998 SPE Annual Technical Conf. & Exh., New Orleans, LA.

Warren, T.M. et al., "Simultaneous Drilling and Reaming with Fixed Blade Reamers", SPE 30474, Oct. 22-25, 1995, pp. 251-261, SPE Annual Technical Conf. & Exh., Dallas, TX.

Warren, T.M. et al., "Development of a Whirl-Resistant Bit", SPE 19572, Oct. 8-11, 1989, pp. 267-274, 1989 SPE Annual Tech. Conf. & Exh., San Antonio, TX.

Williams, J.B. et al., "An Analysis of Predicted Wellbore Trajectory Using a Three-Dimensional Model of a Bottomhole Assembly with Bent Sub, Bent Housing, and Eccentric Contact Capabilities", SPE 19545, Oct. 8-11, 1990, pp. 273-285, $64^{th}$ Annual Technical Conf. and Exh. of the Society of Petroleum Engineers, San Antonio, TX.

Wolf, S.F. et al.,"Field Measurements of Downhole Drillstring Vibrations", SPE 14330, Sep. 22-25, 1985, pp. 1-12, $60^{th}$ Annual Technical Conf. and Exh. of the Society of Petroleum Engineers, Las Vegas, NV.

Worford, S.W. et al., "Shock Absorbers-Are They Necessary?", SPE 11406, Feb. 20-23, 1983, pp. 383-387 & Appendix, IADC/SPE 1983 Drilling Conf., New Orleans, LA.

Yigit, A.S. et al., "Mode Localization May Explain Some of BHA Failures", SPE 39267, Nov. 23-25, 1997, pp. 187-196, 1997 SPE/IADC Middle East Drilling Technology Conf., Bahrain.

Zambudio, C.A. et al., "Effect of Shock Absorber on Drag Bit Chatter", SPE 17194, Feb. 28-Mar. 2, 1988, pp. 153-160, 1988 IADC/SPE Drilling Conf., Dallas, TX.

Zamudio, C.A. et al., "Self-Excited Vibrations in Drillstrings", SPE 16661, Sep. 27-30, 1987, pp. 117-124, $62^{nd}$ Annual Technical Conf. and Exh. of the Society of Petroleum Engineers, Dallas, TX.

*International Search Report*, Jul. 28, 2008, PCT/US2007/025017.

*EP Search Report*, May 15, 2007, RS 115214, US 89930507.

Rewcastle, S.C. et al., "Real-Time Downhole Shock Measurements Increase Drilling Efficiency and Improve MWD Reliability", SPE 23890, Feb. 18-21, 1992, pp. 433-442, 1992 IADC/SPE Drilling Conf., New Orleans, LA.

Robnett, E.W., et al., "Analysis of the Stick-Slip Phenomenon Using Downhole Drillstring Rotation Data", SPE 52821, Mar. 9-11, 1999, pp. 1-12, 1999 SPE/IADC Drilling Conf., Amsterdam, The Netherlands.

Salman, M. et al., "Rotary Drilling US-Khuff Formation with PDC Bits", SPE 53341, Feb. 20-23, 1999, pp. 1-7, 1999 SPE Middle East Oil Show, Bahrain.

Samuel, G.R. et al., "Vibration Analysis, Model Prediction, and Avoidance: A Case History", SPE 102134, Oct. 16-18, 2006, pp. 1-7, 2006 SPE/IADC Indian Drilling Technology Conf. and Exh., Mumbai, India.

Sananikone, P. et al., "A Field Method for Controlling Drillstring Torsional Vibrations", SPE 23891, Feb. 18-21, 1992, pp. 443-452, 1992 IADC/SPE Drilling Conf., New Orleans, LA.

Sathuvalli, U.B. et al., "Advanced Assessment of Drillpipe Fatigue and Application to Critical Well Engineering", SPE 92591, Feb. 23-25, 2005, pp. 1-11, SPE/IADC Drilling Conf., Amsterdam, The Netherlands.

Serrarens, A.F.A., "H-∞ Control as Applied to Torsional Drillstring Dynamics", Mar. 19, 1977, Master Thesis, pp. 1-91, Eindhoven University of Technology, The Netherlands.

Schmalhorst, B. et al., "Drilling Dynamics in the Presence of Mud Flow", SPE 59236, Feb. 23-25, 2000, pp. 1-12, 2000 IADC/SPE Drilling Conf., New Orleans, LA.

Sinor, L.A. et al., "Field Testing of Low-Friction-Gauge PDC Bits", SPE 20416, Sep. 23-26, 1990, pp. 21-27, 1990 SPE Annual Tech. Conf. & Exh., New Orleans, LA.

Skaugen E. et al., "Performance Testing of Shock Absorbers", SPE 15561, Oct. 5-8, 1986, pp. 1-12, $61^{st}$ Annual Technical Conf. & Exh. of the Society of Petroleum Engineers, New Orleans, LA.

Skaugen, E., "The Effects of Quasi-Random Drill Bit Vibrations Upon Drillstring Dynamic Behavior", SPE 16660, Sep. 27-30, 1987, pp. 105-116, $62^{nd}$ Annual Technical Conf. & Exh. of the Society of Petroleum Engineers, Dallas, TX.

Sotomayor, G. P.G. et al., "Drill String Vibration: How to Identify and Supress", SPE 39002, Aug. 30-Sep. 3, 1997, pp. 1-11, Fifth Latin American and Caribbean Petroleum Engineering Conf. & Exh., Rio de Janeiro, Brazil.

Spanos, P.D. et al., "Advances in Dynamic Bottomhole Assembly Modeling and Dynamic Response Determination", SPE 23905, Feb. 18-21, 1992, pp. 581-590, 1992 IADC/SPE Drilling Conf., New Orleans, LA.

Thomas, S. et al., "Expanding Application of PDC into Harder, More Abrasive Formations: Performance Step Change in Saudi Arabia", SPE 92435, Feb. 23-25, 2005, pp. 1-12, SPE/IADC Drilling Conf., Amsterdam, The Netherlands.

Tucker, R.W. et al., On the Effective Control of Torsional Vibrations in Drilling Systems, 1999, pp. 101-122, v. 224(1), Journal of Sound and Vibration.

Van Oort, E. et al., "Drilling More Stable Wells Faster and Cheaper with PDC Bits and Water Based Muds", SPE 59192, Feb. 23-25, 2000, pp. 1-16, 2000 IADC/SPE Drilling Conf., New Orleans, LA.

Vandiver, J.K. et al., "Case Studies of the Bending Vibration and Whirling Motion of Drill Collars", SPE 18652, Feb. 28-Mar. 3, 1989, pp. 282-290, 1989 SPE/IADC Drilling Conf., New Orleans, LA.

Baumgart, A., "Stick-Clip and Bit-Bounce of Deep-Hole Drillstrings", Jun. 2000, pp. 78-82, vol. 122, Transactions of the ASME.

Bailey, J.R., et al., "Drilling Vibrations Modeling and Field Validation", SPE 112650, Mar. 4-6, 2008, 15 pages, 2008 IADC/SPE Drilling Conf., Orlando, FL.

Kyllingstad, A. et al., "A New Stick-Slip Prevention System, SPE 119660, ", Mar. 17-19, 2009, 14 pages, SPE/IADC Drilling Conf., Amsterdam, The Netherlands.

Lin, Y-Q, et al., "Stick-Slip Vibration of Drill Strings", Feb. 1991, pp. 38-43, vol. 113, Transactions of the ASME.

Richard, T. et al., "A Simplified Model to Explore the Root Cause of Stick-Slip Vibrations in Drilling Systems with Drag Bits", 2007, pp. 432-456, vol. 305, Journal of Sound and Vibration.

Sowers, S.F. et al., "Roller Roamers Improve Drilling Performance in Wells Limited by Bit and Bottomhole Assembly Vibrations", SPE 119375, Mar. 17-19, 2009, 8 pages, SPE/IADC Drilling Conf., Amsterdam, The Netherlands.

Yigit, A.S., et al., "Stick-Slip and Bit-Bounce Interaction in Oil-Well Drillstrings", Dec. 2006, pp. 268-274, vol. 128, Transactions of the ASME.

Aarrestad, T.V. et al., "Drillstring Vibrations: Comparison Between Theory and Experiments on a Full-Scale Research Drilling Rig", SPE 14760, Feb. 10-12, 1986, pp. 311-321, 1986 IADC/SPE Drilling Conf., Dallas, TX.

Aarrestad, T.V. et al., "An Experimental and Theoretical Study of a Coupling Mechanism Between Longitudinal and Torsional Drillstring Vibrations at the Bit", Oct. 5-8, 1986, SPE 15563, pp. 12-18, 1986 SPE Annual Tech. Conf. & Exh., New Orleans, LA.

Allen, M.B., "BHA Lateral Vibrations: Case Studies and Evaluation of Important Parameters", SPE 16110, Mar. 15-18, 1987, pp. 531-535, 1987 SPE/IADC Drilling Conf., New Orleans, LA.

Armagost, W.K. et al., "The Successful Use of Anti-Whirl Technology in Conventional Coring", SPE 27473, Feb. 15-18, 1994, pp. 397-407, 1994 IADC/SPE Drilling Conf., Dallas, TX.

Ashton, J.P. et al., "In-Situ Heat System Stimulates Paraffinic-Crude Producers in Gulf of Mexico", SPE 15660, Oct. 5-8, 1986, pp. 157-160, 1986 SPE Annual Tech. Conf. & Exh., New Orleans, LA.

Apostal, M.C. et al., "A Study to Determine the Effect of Damping on Finite-Element-Based, Forced-Frequency-Response Models for Bottomhole Assembly Vibration Analysis", SPE 20458, Sep. 23-26, 1990, pp. 537-550, $68^{th}$ Annual Technical Conf. and Exh. of the Society of Petroleum Engineers, New Orleans, LA.

Baird, J.A. et al., "GEODYN2: A Bottomhole Assembly/Geological Formation Dynamic Interaction Computer Program", SPE 14328, Sep. 22-25, 1985, pp. 1-11, $60^{th}$ Annual Technical Conf. and Exh. of the Society of Petroleum Engineers, Las Vegas, NV.

Behr, S.M. et al., "3D PDC Bit Model Predicts Higher Cutter Loads", SPE 21928, Mar. 11-14, 1991, pp. 253-258, 1991 SPE/IADC Drilling Conf., Amsterdam, The Netherlands.

Besaisow, A.A. et al., "Development of a Surface Drillstring Vibration Measurement System", SPE 14327, Sep. 22-25, 1985, pp. 1-14, $60^{th}$ Annual Technical Conf. and Exh. of the Society of Petroleum Engineers, Las Vegas, NV.

Besaisow, A.A., et al., "A Study of Excitation Mechanisms and Resonances Inducing Bottomhole-Assembly Vibrations", SPE 15365, Oct. 5-8, 1986, pp. 93-101, 1986 SPE Annual Tech. Conf. & Exh., New Orleans, LA.

Besaisow, A.A. et al., "Application of ADAMS (Advanced Drillstring Analysis and Measurement System) and Improved Drilling Performance", SPE 19998, Feb. 27-Mar. 2, 1990, pp. 717-722, 1990 IADC/SPE Drilling Conf., Houston, TX.

Besson, A. et al., "Optimization of the Drilling Performance in the 17½-in. Section of an Exploration Well in the Overthrust of Southern Italy", SPE 23910, Feb. 18-21, 1992, pp. 621-630, 1992 IADC/SPE Drilling Conf., New Orleans, LA.

Booer, A.K. et al., "Drillstring Imaging-An Interpretation of SSPE Drilling & Completion", SPE 23889, Fe. 18-21, 1992, pp. 93-98, 1992 IADC/SPE Drilling Conf., New Orleans, LA.

Brett, J.F. et al., "Bit Whirl: A New Theory of PDC Bit Failure", SPE 19571, Oct. 8-11, 1989, pp. 521-536, $64^{th}$ Annual Technical Conf. and Exh. of the Society of Petroleum Engineers, San Antonio, TX.

Brett, J.F., "The Genesis of Torsional Drillstring Vibrations", SPE 21943, 1991, pp. 168-174, 1991 SPE/IADC Drilling Conf., Amsterdam, The Netherlands.

Burgess, T.M., "Improving BHA Tool Reliability with Drillstring Vibration Models: Field Experience and Limitations", SPE 16109, Mar. 15-18, 1987, pp. 517-530, 1987 SPE/IADC Drilling Conf., New Orleans, LA.

Burgess, T.M. et al., "Wellsite Action on Drilling Mechanics Information Improves Economics", SPE 29431, Feb. 28-Mar. 2, 1995, pp. 855-871, 1994 SPE/IADC Drilling Conf., Amsterdam, The Netherlands.

Brakel, J.D., "Prediction of Wellbore Trajectory Considering Bottom Hole Assembly and Drillbit Dynamics", Thesis, 1987, pp. 28-61, UMI Dissertation Services.

Chen, S.L., et al., "An Improved Transfer Matrix Technique as Applied to BHA Lateral Vibration Analysis", 1995, pp. 93-105, vol. 185(1), Journal of Sound and Vibration.

Chin, W.C., "Wave Propagation in Petroleum Engineering", 1994, pp. 159-162, 170-176, 226-230, 240-242, 254-263, Gulf Publishing Company.

Dykstra, M.W., "Nonlinear Drill String Dynamics", Dissertation, 1996, pp. 74-92, 148-149, 172-178, 185-186, The University of Tulsa.

Firpo, S.E., "Mechanical Behavior of Two-Dimensional Drill Strings in Inclined Holes", Thesis, 1986, pp. 3-12, Rice University.

Jansen, J.D., "Nonlinear Dynamics of Oilwell DrillStrings", Jun. 16, 1993, pp. 38-39, 44, 49-55, 67-69, 96-108, 136-140, 173, 177, Delft University Press.

Lee, H.Y., "Drillstring Axial Vibration and Wave Propagation in Boreholes", 1991, pp. 55-71, 116-122, Massachusetts Institute of Technology.

Li, Z., et al., "Fundamental Equations for Dynamic Analysis of Rod and Pipe String in Oil-Gas Wells and Application in Static Buckling Analysis", 2002, 10 pages, JCPT.

Poletto, F. et al., "Seismic While Drilling—Fundamentals of Drill-Bit Seimsic for Exploration, Chpt. 4—General Theory: Drill-String Waves and Noise Fields", 2004, pp. 163-212, vol. 35, Seismic Exploration.

Roukema, J.C., et al., "Generalized Modeling of Drilling Vibrations. Part II: Chatter Stability in Frequency Domain", 2007, pp. 1474-1485, vol. 47, Int'l. Journal of Machine Tools & Mfg.

Spanos, P.D., et al., "Bottom-Hole Assembly Modeling and Dynamic Response Determination", Sep. 1997, pp. 153-158, vol. 119, Journal of Energy Resources Technology.

Viguie, R. et al., "Using Targeted Energy Transfer to Stabilize Drill-String Systems", 2007, 12 pages, www.dct.tue.nl\ New\ Wouw\IMAC2007_Viguie.

Guo, B. et al., "Bit Wobble: A Kinetic Interpretation of PDC Bit Failure", SPE 28313, Sep. 25-28, 1994, 69$^{TH}$ Annual Technical Conference, pp. 213-228, New Orleans, LA.

PCT International Report on Patentability, Apr. 2, 2010, 26 pages.

* cited by examiner

US 8,504,342 B2

MODELING AND DESIGNING OF WELL DRILLING SYSTEM THAT ACCOUNTS FOR VIBRATIONS

CROSS REFERENCE TO RELATED APPLICATIONS

This application is the National Stage of International Application No. PCT/US07/25017, filed 6 Dec. 2007, which claims the benefit of U.S. Provisional Application No. 60/899,305, filed 2 Feb. 2007.

FIELD OF THE INVENTION

The present invention describes a method for modeling and designing a drilling system that accounts for vibrations, which may be experienced by the drilling system's equipment. In particular, the present invention describes modeling bottom hole assemblies (BHAs) to enhance drilling rate of penetration, to reduce downhole equipment failure, to extend current tool durability and/or to enhance overall drilling performance. The modeling of the BHAs may be used to enhance hydrocarbon recovery by drilling wells more efficiently.

BACKGROUND

This section is intended to introduce various aspects of art, which may be associated with exemplary embodiments of the present techniques. This discussion is believed to be helpful in providing information to facilitate a better understanding of particular aspects of the present techniques. Accordingly, it should be understood that this section should be read in this light, and not necessarily as admissions of prior art.

The production of hydrocarbons, such as oil and gas, has been performed for numerous years. To produce these hydrocarbons, one or more wells in a field are typically drilled into subterranean locations, which are generally referred to as subsurface formations or basins. The wellbores are formed to provide fluid flow paths from the subterranean locations to the surface by drilling operations. The drilling operations typically include the use of a drilling rig coupled to a drillstring and bottom hole assembly (BHA), which may include a drill bit, drill collars, stabilizers, measurement while drilling (MWD) equipment, rotary steerable systems (RSS), hole opening and hole reaming tools, bi-center bits, roller reamers, shock subs, float subs, bit subs, heavy-weight drill pipe, and other components known to those skilled in the art. Once drilling operations are complete, the produced fluids, such as hydrocarbons, are processed and/or transported to delivery locations.

During the drilling operations, various limiters may hinder the rate of penetration (ROP). For instance, vibrations during drilling operations have been identified as one factor that limits the ROP. These vibrations may include lateral, axial and torsional vibrations. Axial vibrations occur as a result of bit/rock interactions and longitudinal drillstring dynamics, and this mode may propagate to surface or may dampen out by contact with the wellbore. Torsional vibrations similarly may involve fluctuations in the torque at the bit and subsequent propagation uphole as a disturbance in the rotary motion of the drillstring. Further, BHA lateral vibrations involve beam bending mode dynamics in the stiff pipe near the bit and do not usually propagate directly to the surface. However, lateral vibrations may couple to the axial and torsional vibrations and therefore be experienced at the surface. Some authors have identified lateral vibrations as the most destructive mode to drilling equipment. The identification of the different types and amplitudes of the vibrations may be provided from downhole sensors in MWD equipment to provide either surface readout of downhole vibrations or stored data that can be downloaded at the surface after the "bitrun" or drilling interval is complete.

As drilling operations are expensive, processes for optimizing drilling operations based on the removal or reduction of founder limiters, such as vibrations, may be beneficial. As an example, BHA's utilized in drilling operations are typically based on designs from service companies, local operating practices and/or prior historical methods, which often lead to random results in the drilling performance. Because vibrations may impact equipment durability, the downhole failure of a BHA may be expensive and significantly increase the costs of drilling a well. Indeed, the costs of BHA failures may include replacement equipment and additional time for a round-trip of the drillstring in the event of a washout (e.g. loss of drillstem pressure) with no parting of the drillstring. Further compounding these costs, sections of the wellbore may be damaged, which may result in sidetracks around the damaged sections of the wellbore.

Accordingly, design tools (e.g. software applications and modeling programs) may be utilized to examine the effect of vibrations on the drilling of a well. For example, modeling programs may represent the static force interactions in a BHA as a function of stabilizer placement. Although there have been numerous attempts to model BHA dynamics, there is a need for model-based design tools to configure BHA designs for evaluating vibration effects as described herein.

In the numerous references cited in this application, there are both time and frequency domain models of drilling assemblies. Because of the interest in direct force calculations for bit design and the rapid increase in computational capability, recent activity has focused on the use of direct time domain simulations and the finite element methods, including both two-dimensional and three-dimensional approaches. However, these simulations still require considerable calculation time, and therefore the number of cases that can be practically considered is limited. The finite element method has also been used for frequency domain models, in which the basic approach is to consider the eigenvalue problem to solve for the critical frequencies and mode shapes. Only a couple of references have used the forced frequency response approach, and these authors chose different model formulations than discussed herein, including a different selection of boundary conditions. One reference used a similar condition at the bit in a finite element model, but a different boundary condition was specified at the top of the bottomhole assembly. This reference did not proceed further to develop the design procedures and methods disclosed herein.

The prior art does not provide tools to support a design process as disclosed herein (i.e. a direct, comparative characterization of the drilling vibration behavior for myriad combinations of rotary speed and weight on bit), and there are no references to design indices or figures of merit to facilitate comparison of the behaviors of different assembly designs. Accordingly, there is a need for such software tools and design metrics to design improved bottomhole assembly configurations to reduce drilling vibrations.

Other related material may be found in the following: G. Heisig et al., "Lateral Drillstring Vibrations in Extended-Reach Wells", SPE 59235, 2000; P. C. Kriesels et al., "Cost Savings through an Integrated Approach to Drillstring Vibration Control", SPE/IADC 57555, 1999; D. Dashevskiy et al., "Application of Neural Networks for Predictive Control in Drilling Dynamics", SPE 56442, 1999; A. S. Yigit et al., "Mode Localization May Explain Some of BHA Failures", SPE 39267, 1997; M. W. Dykstra et al., "Drillstring Component Mass Imbalance: A Major Source of Downhole Vibrations", SPE 29350, 1996; J. W. Nicholson, "An Integrated Approach to Drilling Dynamics Planning, Identification, and Control", SPE/IADC 27537, 1994; P. D. Spanos and M. L. Payne, "Advances in Dynamic Bottomhole Assembly Modeling and Dynamic Response Determination", SPE/IADC 23905, 1992; M. C. Apostal et al., "A Study to Determine the Effect of Damping on Finite-Element-Based, Forced Frequency-Response Models for Bottomhole Assembly Vibration Analysis", SPE 20458, 1990; F. Clayer et al., "The Effect of Surface and Downhole Boundary Conditions on the Vibration of Drillstrings", SPE 20447, 1990; D. Dareing, "Drill Collar Length is a Major Factor in Vibration Control", SPE 11228, 1984; A. A. Besaisow, et al., "Development of a Surface Drillstring Vibration Measurement System", SPE 14327, 1985; M. L. Payne, "Drilling Bottom-Hole Assembly Dynamics", Ph.D. Thesis, Rice University, May 1992; A. Besaisow and M. Payne, "A Study of Excitation Mechanisms and Resonances Inducing Bottomhole-Assembly Vibrations", SPE 15560, 1988; and U.S. Pat. No. 6,785,641.

Further, as part of a modeling system developed by ExxonMobil, a performance index was utilized to provide guidance on individual BHA designs. A steady-state forced frequency response dynamic model was developed to analyze a single BHA in batch mode from a command line interface, using output text files for graphical post-processing using an external software tool, such as Microsoft Excel™. This method was difficult to use, and the limitations of the interface impeded its application. The model was utilized in some commercial applications within the United States since 1992 to place stabilizers to reduce the predicted vibration levels, both in an overall sense and specifically within designed rotary speed ranges. This model provided an End-Point Curvature index for a single BHA configuration. However, it did not provide results for two or more BHA configurations concurrently.

Accordingly, the need exists for a BHA design tool to characterize the vibration performance of alternative BHA designs and to present these results for the purpose of comparing designs and selecting a specific design configuration. Further a method is needed to apply substantially similar excitation boundary conditions and operating parameters to all BHA design configurations, to calculate the model results, and then to display the results on the same plots with identical scaling. To compare the BHA design configurations, metrics and algorithms are needed to facilitate the comparison process and, with underlying vibration dynamic and static models, to provide useful diagnostics to assist in the redesign and selection processes.

SUMMARY OF INVENTION

In one embodiment, a method of modeling drilling equipment is described. The method includes constructing two or more design configurations, wherein each of the design configurations represent at least a portion of a bottom hole assembly (BHA); calculating results from each of the two or more design configurations; simultaneously displaying the calculated results of each of the two or more design configurations.

In a second embodiment, a method of modeling drilling equipment is described. The method includes constructing at least one design configuration representing a portion of a bottom hole assembly (BHA); calculating one or more performance indices that characterize the BHA vibration performance of the at least one design configuration, wherein the one or more performance indices comprise an end-point curvature index, a BHA strain energy index, an average transmitted strain energy index, a transmitted strain energy index, a root-mean-square BHA sideforce index, a root-mean-square BHA torque index, a total BHA sideforce index, a total BHA torque index, and any mathematical combination thereof; and displaying the calculated one or more performance indices of the at least one design configuration.

In a third embodiment, a method of producing hydrocarbons is described. The method includes providing a bottom hole assembly design configuration selected from simultaneous modeling of two or more bottom hole assembly design configurations; drilling a wellbore to a subsurface formation with drilling equipment based on the selected bottom hole assembly design configuration; disposing a wellbore completion into the wellbore; and producing hydrocarbons from the subsurface formation.

In a fourth embodiment, a modeling system is described. The modeling system includes a processor; memory coupled to the processor; and a set of computer readable instructions accessible by the processor. The set of computer readable instructions are configured to construct at least two design configurations, wherein each of the at least two design configurations represent a portion of a bottom hole assembly; calculate results of each of the at least two design configurations; simultaneously display the calculated results of each of the at least two design configurations.

In a fifth embodiment, a method of producing hydrocarbons is described. The method includes providing a bottom hole assembly design configuration selected from modeling of one or more performance indices that characterize the BHA vibration performance of the bottom hole assembly design configuration, wherein the one or more performance indices comprise an end-point curvature index, a BHA strain energy index, an average transmitted strain energy index, a transmitted strain energy index, a root-mean-square BHA sideforce index, a root-mean-square BHA torque index, a total BHA sideforce index, a total BHA torque index, and any mathematical combination thereof; drilling a wellbore to a subsurface formation with drilling equipment based on the bottom hole assembly design configuration; disposing a wellbore completion into the wellbore; and producing hydrocarbons from the subsurface formation.

In one or more of the above embodiments, additional features may be utilized. For example, the methods or computer readable instructions may further include verifying the two or more design configurations by graphically displaying the two or more design configurations simultaneously, selecting one of the two or more design configurations based on the calculated results, identifying operating parameters and boundary conditions; and comparing state variable values in the results for the two or more design configurations, wherein the two or more design configurations are subjected to substantially similar system excitation. Also, constructing the two or more design configurations may include constructing two or more design layouts; associating operating parameters and boundary conditions with the two or more design layouts; and associating equipment parameters with each of the two or more design layouts to create the two or more design configurations. These operating parameters and boundary conditions applied to each of the two or more design configurations are substantially the same or are different. The operating parameters and boundary conditions may include a first modeling set and a second modeling set, the first set of operating parameters and boundary conditions is used to model at least one of static bending, dynamic lateral bending and eccentric whirl and the second set of operating parameters and boundary conditions is used to model another one of static bending, dynamic lateral bending and eccentric whirl.

Further, the calculating the results for two or more design configurations may include generating a mathematical model for each of the two or more design configurations; calculating the results of the mathematical model for specified operating parameters and boundary conditions; identifying the displacements, tilt angle, bending moment, and beam shear force from the results of the mathematical model; and determining state vectors and matrices from the identified outputs of the mathematical model. The model results may be based on a two-dimensional or three-dimensional finite element model from which state vectors and matrices are identified. Moreover, the calculating the results of each of the two or more design configurations may include generating a lumped parameter model of each of the two or more design configurations, wherein the lumped parameter model has a framework of state vector responses and matrix transfer functions; determining a mass element transfer function and a beam element transfer function; and determining boundary conditions and a system excitation to generate the results. The calculated results may be displayed as three dimensional responses, wherein the three dimensional responses are rotated based on movement of one or more virtual slider bars.

Also, in other embodiments, the calculated results may include one or more performance indices that characterize vibration performance of the two or more design configurations. For example, the one or more performance indices may include one or more of an end-point curvature index, a BHA strain energy index, an average transmitted strain energy index, a transmitted strain energy index, a root-mean-square BHA sideforce index, a root-mean-square BHA torque index, a total BHA sideforce index, a total BHA torque index, and any mathematical combination thereof. The various equations for these indices are described further below.

BRIEF DESCRIPTION OF THE DRAWINGS

The foregoing and other advantages of the present technique may become apparent upon reading the following detailed description and upon reference to the drawings in which.

DETAILED DESCRIPTION

In the following detailed description section, the specific embodiments of the present techniques are described in connection with preferred embodiments. However, to the extent that the following description is specific to a particular embodiment or a particular use of the present techniques, this is intended to be for exemplary purposes only and simply provides a concise description of the exemplary embodiments. Accordingly, the invention is not limited to the specific embodiments described below, but rather, it includes all alternatives, modifications, and equivalents falling within the true scope of the appended claims.

The present technique is directed to a method for managing and modeling bottomhole assemblies to evaluate, analyze and assist in the production of hydrocarbons from subsurface formations. Under the present techniques, a modeling mechanism, such as a modeling system may include software or modeling programs that characterize the vibration performance of two or more candidate BHA's simultaneously and/or graphically in what is referred to as "design mode." The BHA used in a drilling system may be selected based on the relative performance indices or indexes for different BHA design configurations. These indices may include end-point curvature index, BHA strain energy index, average transmitted strain energy index, transmitted strain energy index, root-mean-square (RMS) BHA sideforce index, RMS BHA torque index, total BHA sideforce index, and total BHA torque index, which are discussed further below, in addition to specific static design objectives for the respective assembly. Further, the present techniques may also include a "log mode" that compares predicted vibration characteristics with real-time measured data at specific operating conditions. The same indices used in the design mode may be presented in a log mode to compare measured real-time drilling data with the indices to assist in assessing the BHA vibration performance and to gain an understanding of how to evaluate the different performance metrics by comparison with field performance data (e.g. measured data).

Figure 1:
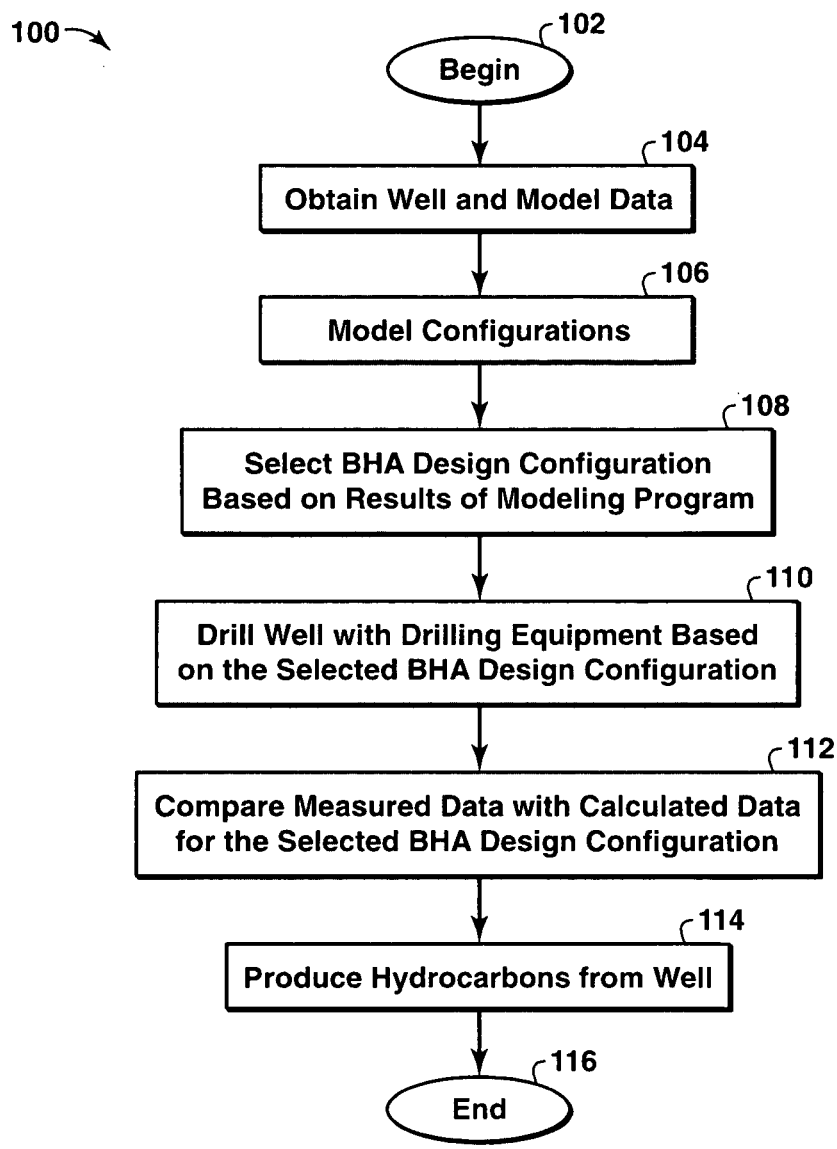
FIG. 1 is an exemplary flow chart of a process of modeling and operating a drilling system in accordance with certain aspects of the present techniques.

Turning now to the drawings, and referring initially to FIG. 1, an exemplary flow chart 100 of a process of modeling and operating a drilling system in accordance with certain aspects of the present techniques is described. In this process, candidate BHA design configurations are modeled together to provide a clear comparison between different models. Each BHA design configuration is a model representation of a BHA that may be utilized as part of drilling operations for a wellbore.

The flow chart begins at block 102. At block 104, data may be obtained for the model. The data may include operating parameters (e.g. weight on bit (WOB) range, rotary speed range (e.g., rotations per minute (RPM)), nominal borehole diameter, hole enlargement, hole angle, drilling fluid density, depth, and the like) and BHA design parameters (e.g., drill collar dimensions and mechanical properties, stabilizer dimensions and locations in the BHA, drill pipe dimensions, length, and the like). Some model-related parameters may also be utilized, such as the vibrational excitation modes to be modeled (specified as multiples of the rotary speed), element length, boundary conditions, and number of "end-length"

elements and the end-length increment value. Then, BHA design configurations may be modeled, as shown in block 106. The modeling of the BHA design configurations may include consideration of the static solutions followed by an investigation into dynamic performance by conducting a simulation and reviewing the results, which is discussed further below. With experience, a BHA design engineer may appreciate the design tradeoffs and, by comparing results for different designs, develop BHA designs with improved operating performance. An example of the modeling design iteration process is described further below in FIG. 2.

Once modeled, one of the BHA design configurations is selected, as shown in block 108. The selection may be based on a comparison of multiple BHA design configurations. That is, the modeling of the BHA design configurations may include different displays of the calculated state vectors (e.g., displacement, tilt, bending moment, lateral shear force of the beam, and BHA/wellbore contact forces and torques) as a function of the operating parameters (e.g. RPM, WOB, etc.), distance to the bit, and BHA design configuration. The displayed results or solutions may include detailed 3-dimensional state vector plots, which are intended to illustrate the vibrational tendencies of alternative BHA design configurations. The selection may include selecting a preferred BHA design configuration in addition to identifying a preferred operating range for the preferred design configuration. The selection may be based on the relative performance of the BHA design configurations, which may be evaluated using a variety of indices, including end-point curvature index, BHA strain energy index, average transmitted strain energy index, transmitted strain energy index, RMS BHA sideforce index, RMS BHA torque index, total BHA sideforce index, total BHA torque index and any mathematical combination thereof.

The selection process also includes consideration of the static results provided by a modeling system. Static model considerations include providing appropriate static bit tilt angle and sideforce values, in addition to low values of static contact forces at contact points, with the understanding that both the static and dynamic sideforces generate torque as the BHA turns, thus serving as drilling energy loss mechanisms. Both static and dynamic performance considerations may be useful in the selection of the optimal BHA design configuration.

At block 110, a well may be drilled with drilling equipment designated in the selected BHA design configuration. The drilling of the well may include forming the wellbore to access a subsurface formation with the drilling equipment. Measured data may then be compared with calculated data for the selected BHA design configuration, as shown in block 112. That is, as the drilling operations are being performed or at some time period following the drilling operations, sensors may be used to collect measured data associated with the operation of the drilling equipment. For example, the measured data may include RPM, WOB, axial, lateral, and stick/slip vibration measurements, drilling performance as determined by the Mechanical Specific Energy (MSE), or other appropriate derived quantities. Downhole data may be either transmitted to the surface in real-time or it may be stored in the downhole equipment and received when the equipment returns to the surface. The measured data may be compared with calculated data from the modeling system for the selected BHA design configuration or a model of the BHA utilized in the drilling operations. This feedback process facilitates modeling validation and verification, and it allows the design engineers to monitor the value of the design process and thereby document improvements to the drilling process. It also helps to determine which of the design index values warrants greater weighting in the BHA selection process, thus providing learning aids to advance the development of the BHA design configuration selection process. Once the wellbore is formed, hydrocarbons may be produced from the well, as shown in block 114. The production of hydrocarbons may include completing the well with a well completion, coupling tubing between the well completion and surface facilities, and/or other known methods for extracting hydrocarbons from a wellbore. Regardless, the process ends at block 116.

Beneficially, the present techniques may be utilized to reduce the limiters that may hinder drilling operations. To facilitate these enhancements, two or more BHA design configurations are compared simultaneously with concurrent calculation and display of model results for two or more designs. With this comparison, the merits of alternative design configurations can be evaluated. Further, with the calculated data and measured data associated with the selected design configuration, other limiters that may be present during the drilling of the wellbore may be identified and addressed in a timely manner to further enhance drilling operations. For example, if the primary limiter appears to be torsional stick/slip vibrations and the sources of torque in the BHA due to contact forces have been minimized, another possible mitigator is to choose a less aggressive bit that generates lower torque for a given applied weight on bit. An example of the modeling of two or more BHA design configurations is described in greater detail below in FIG. 2.

Figure 2:
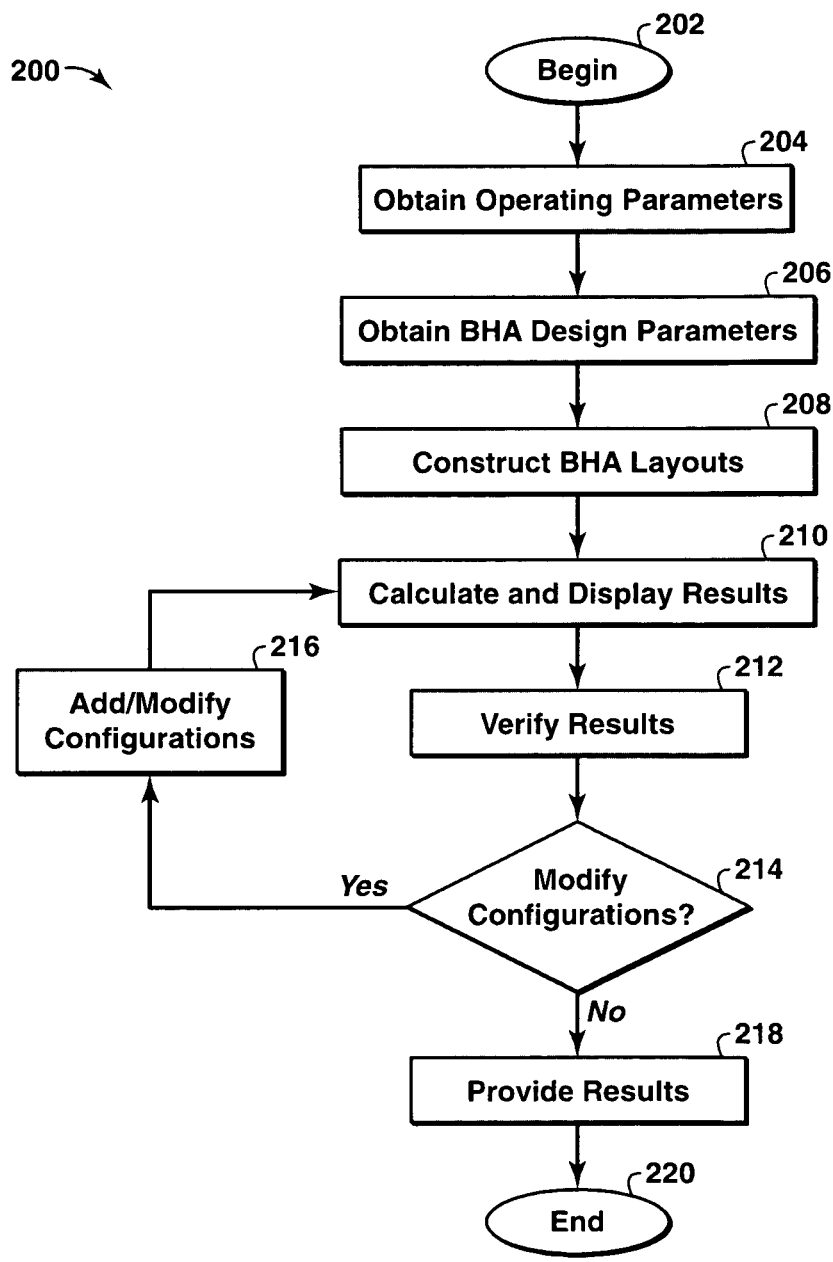
FIG. 2 is an exemplary flow chart for modeling two or more BHA design configurations of FIG. 1 in accordance with certain aspects of the present techniques.

FIG. 2 is an exemplary flow chart 200 of the modeling of two or more BHA design configurations in block 108 of FIG. 1 in accordance with certain aspects of the present techniques. For exemplary purposes, in this flow chart, the modeling of the two or more BHA design configurations is described as being performed by a modeling system. The modeling system may include a computer system that operates a modeling program. The modeling program may include computer readable instructions or code that compares two or more BHA design configurations, which is discussed further below.

The flow chart begins at block 202. To begin, the BHA layout and parameters are obtained to construct the BHA design configurations, as discussed in blocks 204-208. At block 204, operating parameters may be obtained. The operating parameters, such as the anticipated ranges of WOB, RPM and wellbore inclination, may be obtained from a user entering the operating parameters into the modeling system or accessing a file having the operating parameters. For the static model, the condition of the BHA model end-point (e.g. end away from the drill bit) can be set to either a centered condition (e.g. the pipe is centered in the wellbore) or an offset condition (e.g. the pipe is laying on the low side of the wellbore). The BHA design parameters are then obtained, as shown in block 206. As noted above, the BHA design parameters may include available drill collar dimensions and mechanical properties, dimensions of available stabilizers, drill pipe dimensions, length, and the like. For example, if the drilling equipment is a section of tubing or pipe, the BHA design parameters may include the inner diameter (ID), outer diameter (OD), length and bending moment of inertia of the pipe, and the pipe material properties. Also, the modeling system may model drilling equipment made of steel, non-magnetic material, Monel, aluminum, titanium, etc. If the drilling equipment is a stabilizer or under-reamer, the BHA design parameters may include blade OD, blade length, and/or distance to the blades from the ends. At block 208, the initial BHA layouts are obtained. Obtaining of the BHA layouts may include accessing a stored version of a previously modeled or utilized BHA design configuration or BHA layout, interacting with the modeling system to specify or create a BHA layout from the BHA design parameters, or entering a proposed configuration into the model that was provided by the drilling engineer or drilling service provider. The BHA layouts specify the positioning of the equipment and types of equipment in the BHA, usually determined as the distance to the bit of each component.

Once the different BHA design configurations are completed, the results for the selected BHA design configurations are calculated, as shown in block 210. The calculations may include calculation of the static states to determine force and tilt angle at the bit and static stabilizer contact forces, calculation of dynamic performance indices, calculation of dynamic state values for specific excitation modes as a function of rotary speed and distance to bit, and the like. More specifically, the calculations may include the dynamic lateral bending (e.g. flexural mode) and eccentric whirl dynamic response as perturbations about a static equilibrium, which may be calculated using the State Transfer Matrix method described below or other suitable method. This flexural or dynamic lateral bending mode may be referred to as "whirl." The static responses may include the state vector response (e.g. displacement, tilt, bending moment, shear force, and contact forces or torques) as a function of distance from the bit, WOB, and wellbore inclination (e.g. angle or tilt angle). For the dynamic response values, the state variables may be calculated as a function of distance from the drill bit, WOB, RPM, excitation mode, and end-lengths. As used herein, the "excitation mode" is the multiple of the rotary speed at which the system is being excited (for example, it is well known that a roller cone bit provides a three times multiple axial excitation, which may couple to the lateral mode). The "end-length" is the length of pipe added to the top of the BHA, often in the heavy-weight drillpipe, to evaluate the vibrational energy being transmitted uphole. Because the response may be sensitive to the location of the last nodal point, the computational approach is to evaluate a number of such possible locations for this nodal point for the purpose of computing the response. Then these different results are averaged (by root-mean-square (RMS)) to obtain the overall system response for the parametric set of the various excitation modes and end-lengths for each RPM, and the "worst case" maximum value may also be presented, which is described further below. For the lateral bending and eccentric whirl, the model states (e.g. displacement, tilt, bending moment, shear force, and contact forces or torques) may be calculated and displayed as functions of distance from the bit for specified WOB, RPM, excitation mode, and end-length.

Once the results are calculated and displayed, simultaneously as shown in block 210, the results are verified, as shown in block 212. The calculation verification process includes determining by examination that, for example, there were no numerical problems encountered in the simulation and that all excitation modes were adequately simulated throughout the requested range of rotary speeds, bit weights, and end-lengths. Then, a determination is made whether the BHA design configurations are to be modified, as shown in block 214. If the BHA design configurations or specific parameters are to be modified, the BHA design configurations may be modified in block 216. The modifications may include changing specific aspects in the operating parameters, BHA design configurations, BHA design parameters and/or adding a new BHA design configuration. As a specific example, the WOB, RPM and/or excitation mode may be changed to model another set of operating conditions. The BHA design configurations are typically adjusted by altering the distance between points of stabilization, by changing the sizes or number of stabilizers and drill collars, by relocating under-reamers or cross-overs to a different position in the BHA design configuration, and the like. Once the modifications are complete, the results may be recalculated in block 210, and the process may be iterated to further enhance performance.

However, if the BHA design configurations are not to be modified, the results are provided, as shown in block 218. Providing the results may include storing the results in memory, printing a report of the results, and/or displaying the results on a monitor. For example, a side-by-side graphical comparison of selected BHA design configurations may be displayed by the modeling system. The results of some of the calculated static and dynamic responses for specified WOB, RPM, excitation mode, end-lengths, and vibration indices may also be displayed on two-dimensional or three-dimensional plots. Further, if the results are being compared to measured data (e.g. the modeling system is in "log mode"), the results may be displayed in direct comparison to the measured data for certain BHA design configurations. In this mode, the results may be calculated using the specific field operating conditions, such as performing a simulation of the BHA design configuration with the operating parameters (rotary speed and weight on bit) at specified intervals for the respective "bitruns" or applied drilling depth intervals. This mode may facilitate simultaneous comparison of the model results (e.g. calculated data) to measured data, such as ROP, mechanical specific energy (MSE), measured downhole vibrations, and other direct or derived measured field data. Regardless, the process ends at block 220.

Beneficially, the modeling of the BHA design configurations may enhance drilling operations by providing a BHA more suitable to the drilling environment. For example, if one of the BHA design configurations is based on drilling equipment utilized in a certain field, then other designs may be modeled and directly compared with the previously utilized BHA design configuration. That is, one of the BHA design configurations may be used as a benchmark for comparing the vibration tendencies of other BHA design configurations. In this manner, the BHA design configurations may be simultaneously compared to determine a BHA design configuration that reduces the effect of limiters, such as vibrations. For example, one of the selected design configurations may be the baseline assembly, and results are calculated and displayed simultaneously or concurrently for the baseline and the selected other BHA configurations to enable direct and immediate comparison of results. If the modeling system can compare six different BHA design configurations, then five proposed BHA design configurations may be simultaneously compared to the benchmark BHA design configuration. This approach is more practical than trying to optimize a system in the classical sense, such as repeating the adjustments and simulations until at least one drilling performance parameter is determined to be at an optimum value. The relevant question to answer for the drilling engineer relates to which configuration of BHA components operates with the lowest vibrations over the operating conditions for a particular drilling operation. A preferred approach to address this design question is to model several alternative configurations and then select the one that performs in an optimal manner over the expected operating range.

Exemplary BHA Dynamic Vibration Model

As an example, one exemplary embodiment of a BHA dynamic vibration model is described below. However, it should be noted that other BHA models, for example using one or more of the calculation methods discussed above, may also be used to form a comparative performance index in a similar manner. These methods may include but are not limited to two-dimensional or three-dimensional finite element modeling methods. For example, calculating the results for one or more design configurations may include generating a mathematical model for each design configuration; calculating the results of the mathematical model for specified operating parameters and boundary conditions; identifying the displacements, tilt angle (first spatial derivative of displacement), bending moment (calculated from the second spatial derivative of displacement), and beam shear force (calculated from the third spatial derivative of displacement) from the results of the mathematical model; and determining state vectors and matrices from the identified outputs of the mathematical model. In more complex models, these state vectors may be assigned at specific reference nodes, for example at the neutral axis of the BHA cross-section, distributed on the cross-section and along the length of the BHA, or at other convenient reference locations. As such, the state vector response data, calculated from the finite element model results, may then be used to calculate performance indices to evaluate BHA designs and to compare with alternative BHA configurations, as described herein.

The BHA model described herein is a lumped parameter model, which is one embodiment of a mathematical model, implemented within the framework of state vectors and transfer function matrices. The state vector represents a complete description of the BHA system response at any given position in the BHA model, which is usually defined relative to the location of the bit. The transfer function matrix relates the value of the state vector at one location with the value of the state vector at some other location. The total system state includes a static solution plus a dynamic perturbation about the static state. The linear nature of the model for small dynamic perturbations facilitates static versus dynamic decomposition of the system. The dynamic model is one variety in the class of forced frequency response models, with specific matrices and boundary conditions as described below.

Transfer function matrices may be multiplied to determine the response across a series of elements in the model. Thus, a single transfer function can be used to describe the dynamic response between any two points. A lumped parameter model yields an approximation to the response of a continuous system. Discrete point masses in the BHA model are connected by massless springs to other BHA model mass elements and, in one variation, to the wellbore at points of contact by springs and, optionally, damper elements. The masses are free to move laterally within the constraints of the applied loads, including gravity.

Matrix and State Vector Formulation

For lateral motion in a plane, the state vector includes the lateral and angular deflections, as well as the beam bending moment and shear load. The state vector u is extended by a unity constant to allow the matrix equations to include a constant term in each equation that is represented. The state vector u may then be written as equation (e1) as follows:

$$u = \begin{pmatrix} y \\ \theta \\ M \\ V \\ 1 \end{pmatrix} \quad (e1)$$

Where y is lateral deflection of the beam from the centerline of the assembly, $\theta$ is the angular deflection or first spatial derivative of the displacement, M is the bending moment that is calculated from the second spatial derivative of the displacement, and V is the shear load of the beam that is calculated from the third spatial derivative of the displacement. For a three-dimensional model, the state vector defined by equation (e1) may be augmented by additional states to represent the displacements and derivatives at additional nodes. The interactions between the motions at each node may in the general case include coupled terms.

By linearity, the total response may be decomposed into a static component $u^s$ and a dynamic component $u^d$ (e.g. $u=u^s+u^d$).

In the forced frequency response method, the system is assumed to oscillate at the frequency $\omega$ of the forced input, which is a characteristic of linear systems. Then, time and space separate in the dynamic response and using superposition the total displacement of the beam at any axial point x for any time t may be expressed by the equation (e2):

$$u(x,t)=u^s(x)+u^d(x)\sin(\omega t) \quad (e2)$$

State vectors $u_i$ (for element index i ranging from 1 to N) may be used to represent the state of each mass element, and the state vector $u_0$ is used to designate the state at the bit. Transfer function matrices are used to relate the state vector $u_i$ of one mass element to the state $u_{i-1}$ of the preceding mass element. If there is no damping in the model, then the state vectors are real-valued. However, damping may be introduced and then the state vectors may be complex-valued, with no loss of generality.

Because state vectors are used to represent the masses, each mass may be assumed to have an associated spring connecting it to the preceding mass in the model. With the notation $M_i$ denoting a mass transfer matrix, and a beam bending element transfer matrix represented by $B_i$, the combined transfer function $T_i$ is shown by the equation (e3) below.

$$T_i = M_i B_i \quad (e3)$$

Numerical subscripts are used to specify each mass-beam element pair. For example, the state vector $u_1$ may be calculated from the state $u_o$ represented by the equation (e4).

$$u_1 = M_1 B_1 u_0 = T_1 u_0 \text{ and thus } u_i = T_i u_{i-1} \quad (e4)$$

These matrices can be cascaded to proceed up the BHA to successive locations. For example, the state vector $u_2$ may be represented by the equation (e5).

$$u_2 = T_2 u_1 = T_2 T_1 u_0 \quad (e5)$$

while continuing up to a contact point, the state vector $u_N$ may be represented by equation (e6).

$$u_N = T_N u_{N-1} = T_N T_{N-1} \ldots T_1 u_0 \quad (e6)$$

Accordingly, within an interval between contact points, the state $u_j$ at any mass element can be written in terms of any state below that element $u_i$ using a cascaded matrix $S_{ij}$ times the appropriate state vector by the equation (e7):

$$u_j = S_{ij} u_i \text{ where for } i<j, S_{ij} = T_j T_{j-1} \ldots T_{i+1} \quad (e7)$$

Consideration of the state vector solution at the contact points will be discussed below.

Formulation of Mass Matrices

The mass transfer function matrix for the static problem is derived from the balance of forces acting on a mass element m. Generally, each component of the BHA is subdivided into small elements, and this lumped mass element is subjected to beam shear loads, gravitational loading (assuming inclination angle $\phi$), wellbore contact with a stiffness k, and damping force with coefficient b. The general force balance for the element may be written as equation (e8) using the "dot" and "double dot" notations to represent the first and second time derivatives, or velocity and acceleration, respectively.

$$m\ddot{y} = V_i - V_{i-1} - mg\sin\phi - ky - b\dot{y} = 0 \quad (e8)$$

The lumped mass element transfer function matrix under static loading includes the lateral component of gravity (mg sin φ) and either a contact spring force or, alternatively, a constraint applied in the solution process, in which case the value of k is zero. In the static case, the time derivatives are zero, and thus inertial and damping forces are absent. The static mass matrix may be written as the following equation (e9).

$$M_S = \begin{pmatrix} 1 & 0 & 0 & 0 & 0 \\ 0 & 1 & 0 & 0 & 0 \\ 0 & 0 & 1 & 0 & 0 \\ k & 0 & 0 & 1 & (mg\sin\phi) \\ 0 & 0 & 0 & 0 & 1 \end{pmatrix} \quad (e9)$$

In lateral dynamic bending, the forces applied to the mass consist of the beam shear forces, wellbore contact, and damping loads. Again, the wellbore contact may be either the result of a spring force or an applied constraint relation. However, because the dynamic perturbation about the static state is sought (using the principle of linear superposition), the gravitational force is absent from the dynamic mass matrix.

In the dynamic example, the applied loads may be unbalanced, leading to an acceleration of the mass element. The mass times lateral acceleration equals the force balance of the net shear load, spring contact, and damping forces, resulting in the equation (e10).

$$m\ddot{y} = V_i - V_{i-1} - ky - b\dot{y} \quad (e10)$$

Assuming a complex harmonic forced response $y^d \sim e^{j\omega t}$, where j represents the imaginary number equal to $\sqrt{-1}$, the solution to equation (e10) may be found in equation (e11).

$$V_i = V_{i-1} + (k + jb\omega - m\omega^2)y^d \quad (e11)$$

The lumped mass element transfer function matrix $M_B$, for the lateral bending mode dynamic perturbation, is then written by the following equation (e12).

$$M_B = \begin{pmatrix} 1 & 0 & 0 & 0 & 0 \\ 0 & 1 & 0 & 0 & 0 \\ 0 & 0 & 1 & 0 & 0 \\ (k + jb\omega - m\omega^2) & 0 & 0 & 1 & 0 \\ 0 & 0 & 0 & 0 & 1 \end{pmatrix} \quad (e12)$$

The mass matrix in the drill collar dynamic whirl model involves a constant-magnitude force which resembles the gravitational force in the static mass matrix. It is assumed that each drill collar has a slightly unbalanced mass, generating a centrifugal force proportional to this unbalanced mass times the square of the rotational frequency. For a small value ε which represents the dimensionless off-axis distance of the unbalanced mass, the equation of motion for forced response is given by equation (e13).

$$m\ddot{y} = V_i - V_{i-1} + \varepsilon m\omega^2 - ky - b\dot{y} \quad (e13)$$

The radial displacement does not change with time for this simplified whirl mode example, and thus the acceleration and velocity may be set to zero. This represents a steady rotational motion, not unlike a rotating gravitational load, in contrast to the lateral bending mode in which the displacement oscillates through a zero value. The resulting whirl matrix is represented in equation (e14).

$$M_W = \begin{pmatrix} 1 & 0 & 0 & 0 & 0 \\ 0 & 1 & 0 & 0 & 0 \\ 0 & 0 & 1 & 0 & 0 \\ k & 0 & 0 & 1 & (\varepsilon m\omega^2) \\ 0 & 0 & 0 & 0 & 1 \end{pmatrix} \quad (e14)$$

The value ε may take either positive or negative signs in order to represent the shape of the whirl response being modeled. The first whirl mode is generally represented by alternating signs on successive intervals of drill collars as one proceeds up the borehole.

The lumped parameter mass m is defined as the mass of the element piece of the respective BHA component. In addition, the mass of the drill collar or pipe is effectively increased by the drilling fluid contained within the collar and that which is entrained by the BHA element as it vibrates. The technique of "added mass" may be used to approximate this phenomenon. For this purpose, a crude approximation is to increase the dynamic collar mass by 10%, leading to a slight reduction in natural frequency. Note that it is not appropriate to apply the added mass to the static solution. As noted above, depending on the solution method, the spring constant may be omitted if the solution is to apply a constraint relationship such that the BHA model is not permitted to extend outside the wellbore by more than a very small amount.

If the constraint model is not used, then the contact stiffness k in the above relations should be included explicitly. In this example, a factor to be considered in the choice of wellbore contact stiffness k when modeling dynamic excitation is that the value of k should be chosen sufficiently high for the mass m such that the natural frequency $\sqrt{k/m}$ is greater than the maximum excitation frequency ω to be evaluated, so that resonance due to this contact representation is avoided. Thus, for an excitation mode of n times the rotary speed, the contact stiffness k may be greater than $m(n\omega)^2$ (e.g. $k > m(n\omega)^2$).

Alternatively, and in the preferred embodiment, compliance at the points of contact between BHA and wellbore may be neglected and a fixed constraint relationship applied in the solution method, with k=0 in the matrices above. This approach is described further below.

Formulation of Stiffness Matrix

The Euler-Bernoulli beam bending equation for a uniform beam with constant Young's modulus E, bending moment of inertia I, and axial loading P may be written as the fourth-order partial differential equation (e15).

$$EI\frac{\partial^4 y}{\partial x^4} - P\frac{\partial^2 y}{\partial x^2} = 0 \quad (e15)$$

The characteristic equation for the general solution is represented by equation (e16)

$$y = e^{\beta x} \quad (e16)$$

This equation expresses the lateral displacement as the exponential power of a parameter β times the distance x from a reference point, in which the term β is to be found by replacing this solution in equation (e15) and solving with equations (e17) and (e18) below.

$$\beta^2\left(\beta^2 - \frac{P}{EI}\right) = 0 \tag{e17}$$

$$\beta = 0, \quad \pm\sqrt{\frac{P}{EI}} \tag{e18}$$

Note that $\beta$ is either real (beam in tension), imaginary (beam in compression), or 0 (no axial loading). The appropriate particular solution is a constant plus linear term in x. Thus, the displacement of an axially loaded beam may be represented by the equation (e19).

$$y = a + bx + ce^{\beta x} + de^{-\beta x} \tag{e19}$$

where the constants a, b, c, and d are to found by satisfying the boundary conditions.

The remaining components of the state vector are determined by the following equations in the spatial derivatives of lateral displacement with the axial coordinate x (e20).

$$\theta = \frac{\partial y}{\partial x} \tag{e20}$$

$$M = EI\frac{\partial^2 y}{\partial x^2}$$

$$V = -EI\frac{\partial^3 y}{\partial x^3}$$

The resulting beam bending stiffness transfer function matrix B may be represented by the following equation (e21).

$$B = \begin{pmatrix} 1 & L & \left(\frac{-2 + e^{\beta L} + e^{-\beta L}}{2\beta^2 EI}\right) & \left(\frac{2\beta L - e^{\beta L} + e^{-\beta L}}{2\beta^3 EI}\right) & 0 \\ 0 & 1 & \left(\frac{e^{\beta L} - e^{-\beta L}}{2\beta EI}\right) & \left(\frac{2 - e^{\beta L} - e^{-\beta L}}{2\beta^2 EI}\right) & 0 \\ 0 & 0 & \left(\frac{e^{\beta L} + e^{-\beta L}}{2}\right) & \left(\frac{-e^{\beta L} + e^{-\beta L}}{2\beta}\right) & 0 \\ 0 & 0 & \left(\frac{-\beta e^{\beta L} + \beta e^{-\beta L}}{2}\right) & \left(\frac{e^{\beta L} + e^{-\beta L}}{2}\right) & 0 \\ 0 & 0 & 0 & 0 & 1 \end{pmatrix} \tag{e21}$$

Boundary Conditions and System Excitation

With the mass and beam element transfer functions defined, the boundary conditions and system excitation are determined to generate model predictions. Separate boundary conditions are used to model the static bending, dynamic lateral bending, and eccentric whirl problems.

In each of these examples, the solution proceeds from the bit to the first stabilizer, then from the first stabilizer to the second stabilizer, and so on, proceeding uphole one solution interval at a time (e.g. from the bit as the starting interval). Finally, the interval from the top stabilizer to the end point is solved. The end point is the upper node of the BHA model, and it may be varied to consider different possible nodal points at the "end-length." An appropriate lateral displacement for this end point is assumed in the static model, based on the amount of clearance between the pipe and the wellbore.

In this method, the states in each solution interval are determined by three conditions at the lower element (bit or bottom stabilizer in the interval), and one condition at the upper element (end point or top stabilizer in the interval). With these four conditions and the overall matrix transfer function from the lower to the upper element, the remaining unknown states at the lower element may be calculated.

Beginning at the bit, the displacement of the first stabilizer is used to determine the bit state, and thus all states up to the first stabilizer are determined using the appropriate transfer function matrices. By continuity, the displacement, tilt, and moment are now determined at the first stabilizer point of contact. The beam shear load is undetermined, as this state does not have a continuity constraint because there is an unknown side force acting between the stabilizer and the wellbore. The displacement of the next stabilizer is used to provide the fourth condition necessary to obtain the solution over the next interval, and thus the complete state at the stabilizer is determined. The contact force between stabilizer and wellbore may be calculated as the difference between this state value and the prior shear load calculation from the previous BHA section. Using the cascaded matrix formulation in equation (e22).

$$\begin{pmatrix} y_j \\ \theta_j \\ M_j \\ V_j \\ 1 \end{pmatrix} = S_{ij} \begin{pmatrix} y_i \\ \theta_i \\ M_i \\ V_i \\ 1 \end{pmatrix} \text{ with the conditions } \begin{pmatrix} V_i \text{ unknown} \\ y_j = 0 \end{pmatrix} \tag{e22}$$

Then the unknown shear load at the lower stabilizer is calculated using an equation (e23) to obtain zero displacement at the upper position.

$$0 = S_{11}y_i + S_{12}\theta_i + S_{13}M_i + S_{14}V_i + S_{15} \tag{e23}$$

The beam shear load is discontinuous across the contact points, and the sideforce at such a node may be calculated as the difference between the value obtained by propagating the states from below, $V_i^-$, and the value calculated to satisfy the constraint relation for the next segment, $V_i^+$. Therefore, the contact sideforce may be represented by the equation (e24).

$$F_i = V_i^+ - V_i^- \tag{e24}$$

For the static example, the tilt and sideforce are unknown at the bit. A trial bit tilt angle is used to generate a response and the state vectors are propagated uphole from one contact point to the next, finally reaching the end-point. The final value for the bit tilt angle and sideforce are determined by iterating until the appropriate end condition is reached at the top of the model, for instance a condition of tangency between the pipe and borehole wall.

For the dynamic models (flexural bending, whirl, and twirl), a reference bit excitation sideforce is applied, e.g. $V_{bit}$=const. The first stabilizer lateral position is assumed constrained to zero by the pinned condition. To uniquely solve the equations from the bit up to the first stabilizer, two more conditions are specified. One choice for the boundary conditions is to assume that for small lateral motion, the tilt and moment at the bit are zero. This set of boundary conditions may be written as shown in equation (e25):

$$y_{stab} = \theta_{bit} = M_{bit} = 0 \quad V_{bit} = \text{const} \tag{e25}$$

An alternate set of boundary conditions may be considered by assuming that the tilt angle at the first stabilizer is zero, equivalent to a cantilevered condition, and that there is no moment at the bit. This alternate set of boundary conditions may be written shown in equation (e26):

$$y_{stab} = \theta_{stab} = M_{bit} = 0 \quad V_{bit} = \text{const} \tag{e26}$$

The solution marches uphole one stabilizer at a time, terminating at the last node which is arbitrarily chosen but located at different "end-lengths" in the dynamic case. By selecting different end-lengths and RMS-averaging the results, performance indices may be formed that are robust. To guard against strong resonance at an individual nodal point, the maximum result is also examined. These techniques were required for the early model that used the end-point curvature index described below, as these results were found to be sensitive to the selection of the nodal point location. It may be noted that the new BHA performance indices are less sensitive to the end condition of the BHA and thus may be preferred. It should further be noted that BHA contact with the borehole at locations between stabilizers may optionally be treated as a nodal point in this analysis method, and the solution propagation modified accordingly.

BHA Performance Indices

The vectors of state variables described above may be utilized to provide various indices that are utilized to characterize the BHA vibration performance of different BHA design configurations. While it should be appreciated that other combinations of state variables and quantities derived from the fundamental state variables may also be utilized, the end-point curvature index, BHA strain energy index, average transmitted strain energy index, transmitted strain energy index, RMS BHA sideforce index, RMS BHA torque index, total BHA sideforce index, and total BHA torque index are discussed further below.

The BHA design configuration includes components from a lower section at the bit through most or all of the drill collars, and an upper section which is the last component in the BHA design configuration and is generally the heavy-weight drill pipe. Various nodes N may be used in the model of the BHA design configuration with node 1 being at the bit. The first element in the upper section has the index "U", and the last element in the lower section has index "L," i.e. U=L+1. Furthermore, there are "C" contact points with contact forces "$F_j$" where the index j ranges over the BHA elements that are in contact with the wellbore. From these dynamic states, various indices may be calculated. For instance, the end-point curvature index may be represented by equation (e27), which is noted below.

$$PI = \alpha \frac{M_N}{(EI)_N} \quad (e27)$$

Where PI is a performance index, $M_N$ is the bending moment at the last element in the model, $(EI)_N$ is the bending stiffness of this element, and $\alpha$ is a constant. It should be noted that the $\alpha$ may be $7.33 \times 10^5$ or other suitable constant.

Similarly, the BHA strain energy index may be represented by the equation (e28), which is noted below:

$$PI = \frac{1}{L} \sum_{i=1}^{L} \frac{M_i^2}{2(EI)_i} \quad (e28)$$

Where the summation is taken over the L elements in the lower portion of the BHA, and the index i refers to each of these elements.

The average transmitted strain energy index may be represented by the equation (e29), which is as follows:

$$PI = \frac{1}{(N-U+1)} \sum_{i=U}^{N} \frac{M_i^2}{2(EI)_i} \quad (e29)$$

Where N is the total number of elements and U is the first element of the upper part of the BHA (usually the heavy-weight drillpipe), and the summation is taken over this upper BHA portion.

With the observation that the transmitted bending moments appear sinusoidal and somewhat independent of end-length in this uniform interval of pipe (e.g. M~$M_0$ sin kx), the transmitted strain energy index may be expressed more simply in equation (e30) as follows:

$$PI = \frac{\left(\max_{i=U}^{N}(M_i) - \min_{i=U}^{N}(M_i)\right)^2}{16(EI)_N} \quad (e30)$$

Where the maximum and minimum bending moments in the upper portion of the BHA are averaged and then used as a proxy for the amplitude of the disturbance. This transmitted strain energy index varies less with the end-length and is thus more computationally efficient than the end-point curvature index given by (e27), although they both measure the amount of energy being imparted to the drillstring above the BHA proper.

Further, the RMS BHA sideforce index and total BHA sideforce index may be represented by the equations (e31) and (e32), respectively, which are provided below:

$$PI = \sqrt{\frac{1}{C} \sum_{j=1}^{C} F_j^2} \quad (e31)$$

$$PI = \sum_{j=1}^{C} |F_j| \quad (e32)$$

Where the contact force $F_j$ is calculated for each of the C contact points from the constraints and solution propagation as discussed above, and the summation is taken over the contact forces at these locations using the contact point index j.

The dynamic sideforce values may be converted to corresponding dynamic torque values using the applied moment arm (radius to contact point $r_j$) and the appropriate coefficient of friction at each respective point $\mu_j$. Summing again over the elements in contact with the borehole, the RMS BHA torque index and total BHA torque index may be represented by the equations (e33) and (e34), respectively, which are provided below:

$$PI = \sqrt{\frac{1}{C} \sum_{j=1}^{C} (\mu_j r_j F_j)^2} \quad (e33)$$

$$PI = \sum_{j=1}^{C} |\mu_j r_j F_j| \quad (e34)$$

This modified index accounts for the dynamic torsional effects of the potentially large dynamic sideforces, providing a lower index value for improvements, such as reduced friction coefficients and use of roller reamers, which are known to provide lower vibrations in the field.

The RMS sideforce and torque index values present an average value of this source of dynamic resistance, whereas the total sideforce and torque index values represent the summation of this resistance over each of the BHA contact points. Both may provide useful diagnostic information. In the preferred embodiment, the RMS BHA sideforce index provides an average stabilizer reaction force, and the total BHA torque index shows the combined rotational resistance of all contact points, taking into account the diameter of the parts in contact with the wellbore and the respective coefficient of friction. This index provides valuable information to assist in design mitigation of stick-slip torsional vibrations.

In the preferred embodiment of the method, the performance indices or indexes are calculated a number of times for each rotary speed and bit weight for each design configuration. The different excitation modes in the flexural bending mode are represented by different frequencies of the applied force at the bit. Because the nodal point at the top of the BHA is not known, dynamic results are calculated for a variety of nodal point "end-lengths" for both the flexural bending and twirl modes. These iterations yield multiple performance index values for each rotary speed and bit weight, and it is appropriate to reduce these different values to an RMS average value and a maximum value to simplify the analysis and display of these results.

The RMS average of a performance index is defined by equation (e35):

$$PI' = \sqrt{\frac{1}{mn}\sum_{i=1}^{m}\sum_{j=1}^{n}(PI)_{ij}^2} \quad (e35)$$

wherein PI' is the RMS average of the desired performance index and $(PI)_{ij}$ is one of the indices defined in equations (e27), (e28), (e29), (e30), (e31), (e32), (e33), or (e34) for the $i^{th}$ of the m modes and $j^{th}$ of the n BHA end-lengths in the model.

The maximum of a performance index is defined by equation (e36):

$$PI' = \max_{i=1}^{m}\left\{\max_{j=1}^{n}(PI)_{ij}\right\} \quad (e36)$$

wherein PI' is the maximum value of the desired performance index and $(PI)_{ij}$ is one of the indices defined in equations (e27), (e28), (e29), (e30), (e31), (e32), (e33), or (e34) for the $i^{th}$ of the m modes and $j^{th}$ of the n BHA end-lengths in the model.

Exemplary Embodiment

Figure 3:
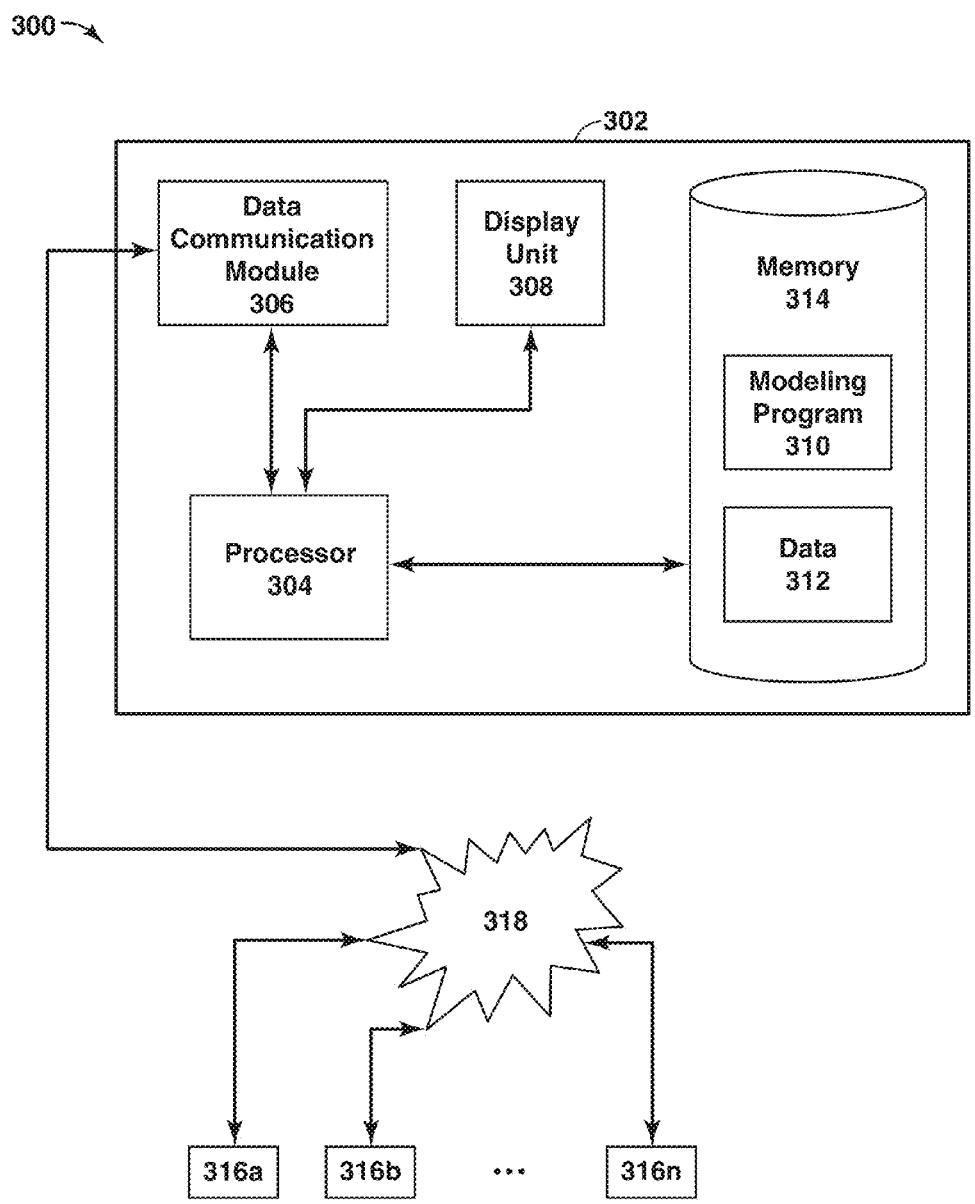
FIG. 3 is an exemplary embodiment of a modeling system in accordance with certain aspects of the present techniques.

As exemplary embodiment, the methods described above may be implemented in a modeling system, as shown in FIG. 3. FIG. 3 is an exemplary embodiment of a modeling system 300 having different elements and components that are utilized to model, calculate and display the results of the calculations (e.g. simulated results of calculated data in graphical or textual form) of the BHA design configurations. The modeling system 300 may include a computer system 302 that has a processor 304, data communication module 306, monitor or display unit 308 and one or more modeling programs 310 (e.g. routines, applications or set of computer readable instructions) and data 312 stored in memory 314 in files or other storage structures. The computer system 302 may be a conventional system that also includes a keyboard, mouse and other user interfaces for interacting with a user. The modeling programs 310 may include the code configured to perform the methods described above, while the data 312 may include measured data, results, calculated data, operating parameters, BHA design parameters, and/or other information utilized in the methods described above. Of course, the memory 314 may be any conventional type of computer readable storage used for storing applications, which may include hard disk drives, floppy disks, CD-ROMs and other optical media, magnetic tape, and the like.

Because the computer system 302 may communicate with other devices, such as client devices 316a-316n, the data communication module 306 may be configured to interact with other devices over a network 318. For example, the client devices 316a-316n may include computer systems or other processor based devices that exchange data, such as the modeling program 310 and the data 312, with computer system 302. In particular, the client devices 316a-316n may be associated with drilling equipment at a well location or may be located within an office building and utilized to model BHA design configurations. As these devices may be located in different geographic locations, such as different offices, buildings, cities, or countries, a network 318 may be utilized to provide the communication between different geographical locations. The network 318, which may include different network devices, such as routers, switches, bridges, for example, may include one or more local area networks, wide area networks, server area networks, metropolitan area networks, or combination of these different types of networks. The connectivity and use of the network 318 by the devices in the modeling system 300 is understood by those skilled in the art.

To utilize the modeling system, a user may interact with the modeling program 310 via graphical user interfaces (GUIs), which are described in various screen views in FIGS. 4, 5A-5D, 6A-6I, 7A-7B, 8A-8E, and 9A-9D. Via the screen views or through direct interaction, a user may launch the modeling program to perform the methods described above. For example, model results may be generated for various BHA design configurations and specific operating conditions, such as the sample output in these figures. The results may be graphically tabulated or displayed simultaneously for direct comparison of different BHA design configurations. Accordingly, FIGS. 4, 5A-5D, 6A-6I, 7A-7B, 8A-8E, and 9A-9D are exemplary screen views of a modeling program in accordance with some aspects of the present techniques. As the screen views are associated with modeling system 300, FIGS. 4, 5A-5D, 6A-6I, 7A-7B, 8A-8E, and 9A-9D may be best understood by concurrently viewing FIG. 3 and other FIGS. 4, 5A-5D, 6A-6I, 7A-7B, 8A-8E, and 9A-9D Further, it should be noted that the various menu bars, virtual buttons and virtual slider bars, which may operate in similar manners, may utilize the same reference numerals in the different screen views for simplicity in the discussion below.

Figure 4:
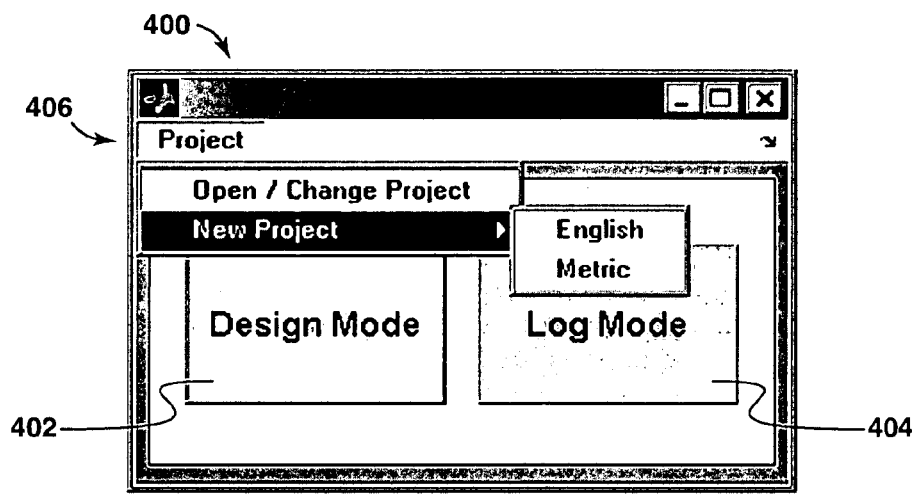
FIG. 4 is an exemplary screen view provided by the modeling system of FIG. 3 utilized in accordance with some aspects of the present techniques.

In FIG. 4, a screen view 400 of the startup image for the modeling program is shown. In this screen view 400, a first virtual button 402 and a second virtual button 404 are presented along with menu options in a menu bar 406. The first virtual button 402, which is labeled "Design Mode," is selected for the user to operate the modeling program 310 to model various BHA design configurations. In typical applications, design mode is used to compare alternative BHA design configurations so that the optimal BHA design configuration may be used for the drilling process. The screen views associated with the design mode are presented in FIGS. 4, 5A-5D, 6A-6I, 7A-7B, and 8A-8E. The second virtual button 404, which is labeled "Log Mode," may be selected to operate the modeling program 310 in a log mode that compares the measured data from a BHA design configuration to various modeled BHA design configurations, which may operate under similar operating conditions (e.g. operating parameters). In log mode, the results of measured data from one or more drilling intervals are presented alongside the model predictions to evaluate the indices relative to the actual data. The screen views specific to the log mode are presented in FIGS. 9A-9D. The menu options in the menu bar 406 may include an "Open/Change Project" option to select an existing BHA design configuration or a "New Project" option that may initialize a new BHA design configuration, which may be in English or metric units as indicated in the submenu.

Figure 5A:
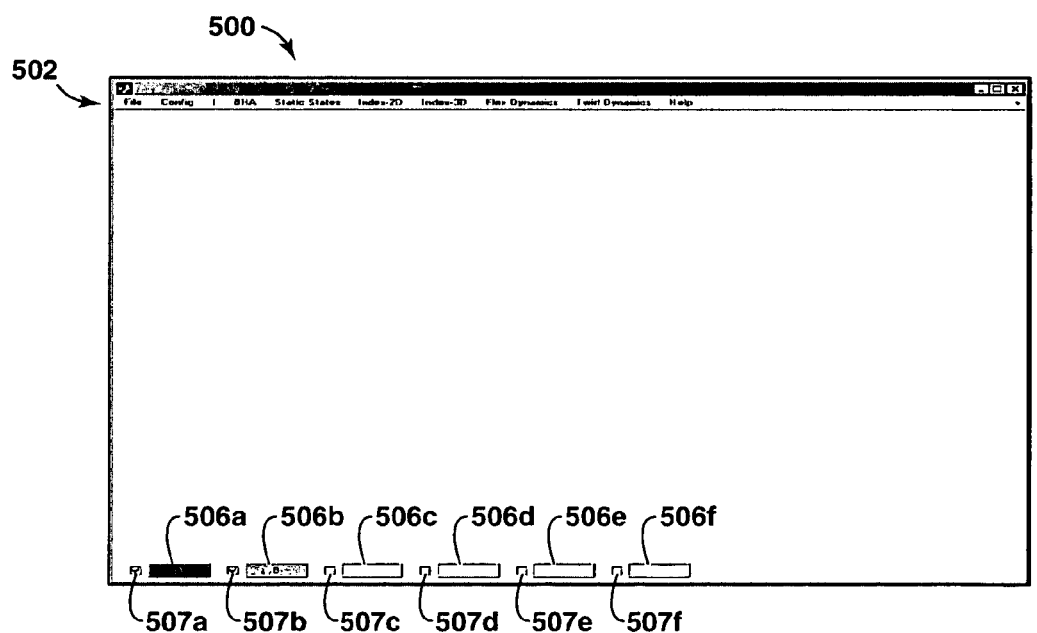
FIGS. 5A-5D are exemplary screen views provided by the modeling system of FIG. 3 utilized in a Design Mode to construct BHA design configurations in accordance with some aspects of the present techniques.
Figure 5B:
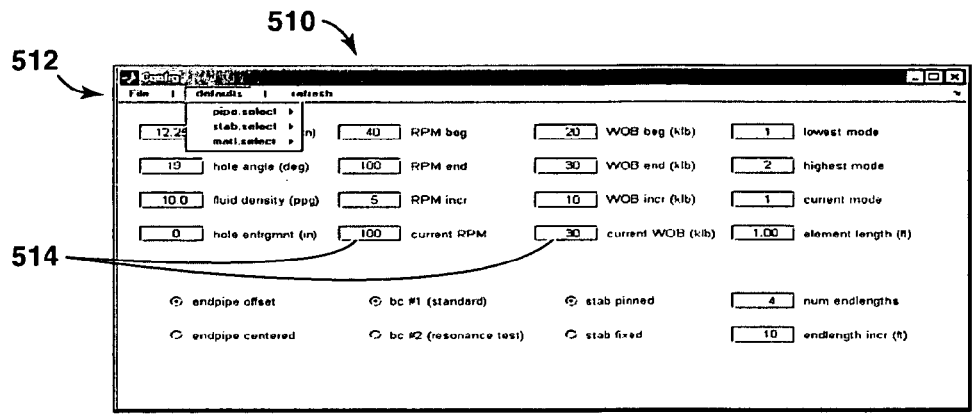

If the design mode is selected, a screen view 500 of a blank panel is presented, as shown in FIG. 5A. The menu tabs in the menu bar 502 are a typical "File" menu tab to enable printing, print setup, and exit commands, and a configuration menu tab labeled "Config," The configuration menu tab invokes the configuration panel as shown in FIG. 5B. The menu bar 502 may also include one or more Design Mode processes, e.g. "BHA," "Static States," "Index 2D," "Index 3D," "Flex Dynamics," "Twirl Dynamics," and "Help." These different process menu items are explained in more detail below, but the processing concept is to apply each of these methods to the selected BHA designs for which the check boxes 507a-507f are selected. Each process enables the screen controls and display data as required for the process to execute, in this sense the screen may be considered to be "context sensitive."

Also, virtual buttons 506a-506f may be utilized to access and modify the different BHA design configurations. In this example, two BHA design configurations, which are "A" associated with virtual button 506a and "B" associated with virtual button 506b, are configured, while virtual buttons 506c-506f do not have BHA design configurations associated with them. Further, the virtual check boxes 507a-507f next to the names of the BHA design configurations may be used to include specific BHA design configurations as part of the process calculations to compare the BHA design configurations. As indicated in this example, the BHA design configuration "A," which may be referred to as BHA design configuration A, and BHA design configuration "B," which may be referred to as BHA design configuration B, are to be compared in the different screen views provided below.

As shown in FIG. 5B, if the "Config" menu tab is selected from the menu bar 502, screen view 510 may be presented to define the relevant operating parameters for the modeling process, as described below. In screen view 510, menu tabs in the menu bar 512 may be utilized to adjust the default pipe, stabilizer, and material properties for inserting new BHA components in the BHA design panel. The menu bar 512 may include a file menu tab (labeled "File"), a refresh menu tab (labeled "refresh"), and a defaults menu tab (labeled "defaults"), which may include various submenus for different types of pipes, stabilizers and materials. In particular, for this exemplary screen view 510, various values of the BHA design and operating parameters are presented and may be modified in the text boxes 514. The text boxes 514 include nominal hole diameter in inches (in); hole inclination in degrees (deg); fluid density in pounds per gallon (ppg); WOB range in kilo-pounds (klb); rotary speed range in RPM; excitation mode range; static end-point boundary condition (e.g. offset or centered); boundary condition at the bit for flexural dynamic bending; stabilizer model (pinned or fixed); the number of end lengths; and the end-length increment in feet (ft). For projects that are specified in metric units, the corresponding metric units may be used.

In an alternative embodiment, the configuration file may supplement the inclination angle with the rate of change of inclination angle for curved wellbores. More generally, for three-dimensional models, the rate of change of azimuth angle may also be included. Furthermore, a wellbore survey file may be identified and read by the program to provide input data to model a specific drilling application.

Figure 5C:
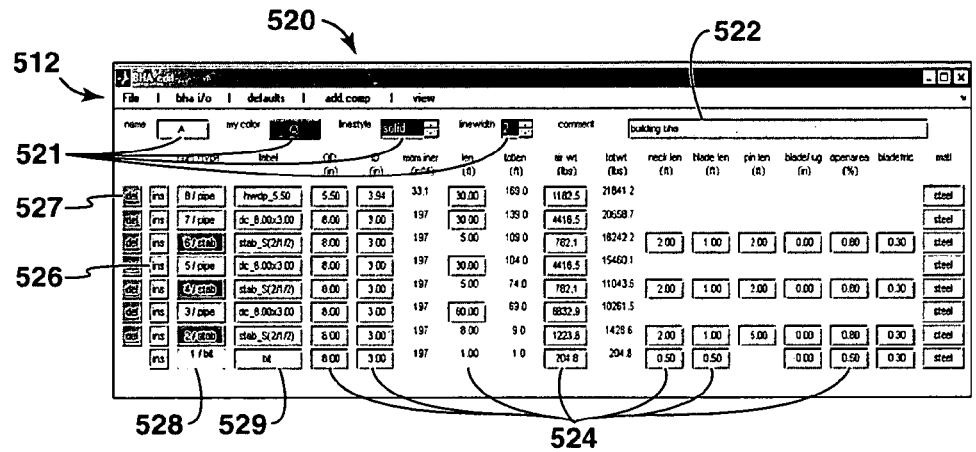

The description for each of the BHA design configurations may be presented from the BHA design tabs 506a-506f in FIG. 5A. As one example, FIG. 5C is an exemplary screen view 520 of a configuration panel for describing the BHA design configuration A, which is accessed by selecting the BHA design tab 506a. The screen view 520 includes the different control boxes 521 for the specific BHA design configuration, such as BHA design configuration name of "A," a designated color of "dark gray," a linestyle of "solid," and line width as "2." In addition, an additional text box 522 may be utilized for additional information, such as "building bha." The BHA design menu bar 512 has a "bha i/o" menu option to facilitate import and export of bha model descriptions, a "defaults" menu for the local selection of default pipe, stabilizer, and material properties, an "add.comp" menu to append multiple elements to the top of the model description, and a "view" menu option to enable scrolling the display to access BHA components not visible in the current window.

The virtual buttons 526, 527 and 528, along with edit boxes 529 provide mechanisms to modify the layout of the BHA assembly for a specific BHA design configuration. The components and equipment may be inserted and deleted from the selected BHA layout by pressing the corresponding virtual buttons, which are an insert virtual button 526 labeled "ins" and a delete virtual button 527 labeled "del." The virtual buttons 528 indicate the element index number and whether an element is a pipe or stabilizer element, which may be indicated by colors (e.g. light or dark gray) or by text (e.g. stab or pipe). Pressing one of the virtual buttons 528 toggles an element from a pipe to a stabilizer, or vice versa. The currently selected default pipe or stabilizer type is set for the new toggled element. Edit boxes 529 are initialized to the label of the respective input data table that is read from a file, such as a Microsoft Excel™ file, or may be modified by entering data directly into the text box. By typing over the edit boxes 529, the list may be customized by the user. Right-clicking on one of the edit boxes 529 brings up a popup menu to select any of the pre-existing elements of that type, after which the values for OD, ID, and other parameters may be pre-populated. Any of the edit boxes 529 may then be modified after being initialized in this way to provide full customization of BHA components.

In addition to specifying the layout of the BHA design configuration, the screen view 520 includes material information for each component in a BHA design configuration, as shown in the text boxes 524. In this specific example, the text boxes 524 include the outer diameter (OD), inner diameter (ID), length (len), total length (totlen), moment of inertia (mom.iner), air weight (wt), total air weight (totwt), neck length (neck.len), blade length (blade.len), pin length (pin.length), stabilizer blade undergauge clearance (blade/ug), percent blade open area (openarea), blade friction coefficient for calculating torque from contact sideforce (bladefric), and material (matl). The total length, total weight, and moment of inertia are calculated by the modeling program and not the user, whereas the other text boxes 524 may be edited by the user. Further, to model unusual components, it may be possible to overwrite the calculated weight value for a given component. For example, if the total weight of the component is known, then it can be entered into the respective text box 524 directly to replace the value in the BHA design configuration. The modeling program may adjust the density of the material to match the value entered by a user based on the OD, ID and overall length of the component. This aspect may be useful when matching the stiffness and mass values for components that may only be approximated because of certain geometrical factors (e.g., an under-reamer with cutting structure located above a bull nose). That is, both inertia and stiffness values may be matched even though the geometry may not be well represented by a simple cylindrical object. In this way, an equivalent cylindrical section may be generated to approximate the dynamic characteristics of the actual drilling component.

The modeling program may include various limitations on the specific component positioning in the BHA layout. For example, the BHA assemblies may have to begin with a drill bit element and end with a pipe section. Similarly, stabilizers may not be allowed to be the top component of the BHA layout.

Figure 5D:
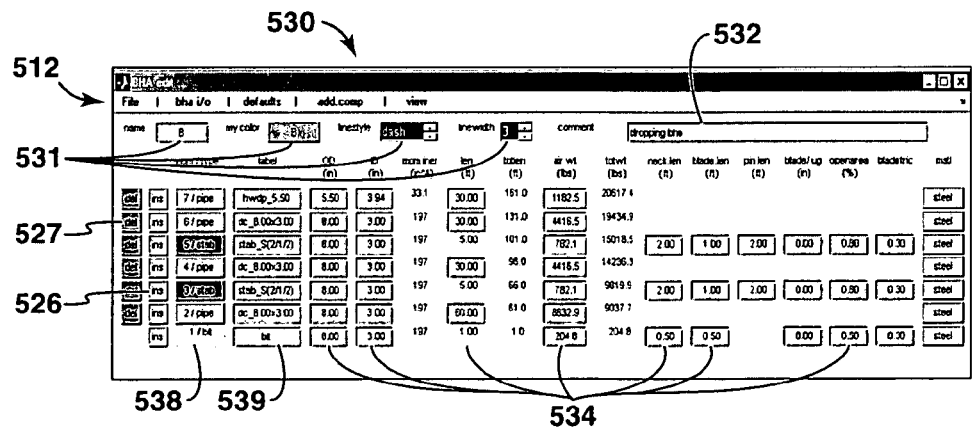

As another example, FIG. 5D is an exemplary screen view 530 of a configuration panel for describing the BHA design configuration B, which is accessed by selecting the BHA design tab 506b. The screen view 530 includes different control boxes 531, such as the specific BHA design configuration name of "B," a designated color of "light gray," a linestyle of "dash," and a linewidth of "3." In addition, a descriptive comment may be provided in text box 532. The screen view 530 includes the same virtual buttons 526 and 527 as FIG. 5D, in addition to virtual boxes 538 and text boxes 534 and 539, which are specific to define the BHA design configuration B. In this specific example, the difference between A and B is the near-bit stabilizer in BHA design configuration A. This component tends to build wellbore inclination angle for the BHA design configuration A, whereas the absence of this component tends to drop angle for the BHA design configuration B, as described in more detail below. Once the parameters and layout are specified for the BHA design configurations, the BHA design configurations can be verified by the user by viewing graphical or textual displays of the BHA design configuration, as seen in FIGS. 6A and 6B.

Figure 6A:
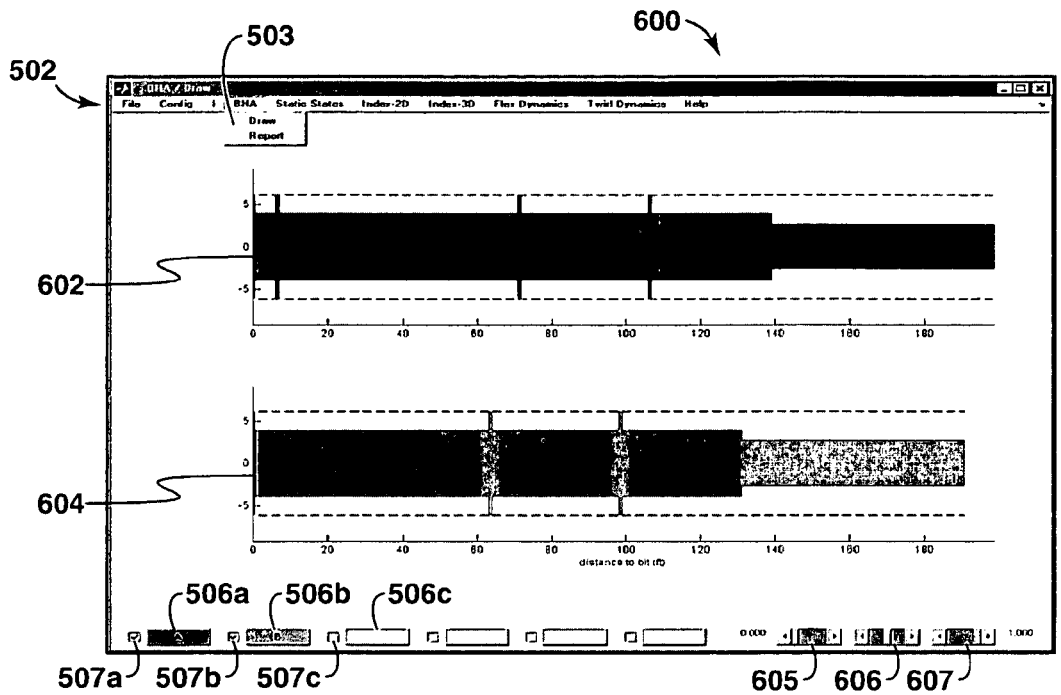
FIGS. 6A-6I are exemplary screen views provided by the modeling system of FIG. 3 utilized in a Design Mode to simultaneously display constructed BHA design configurations in accordance with some aspects of the present techniques.
Figure 6B:
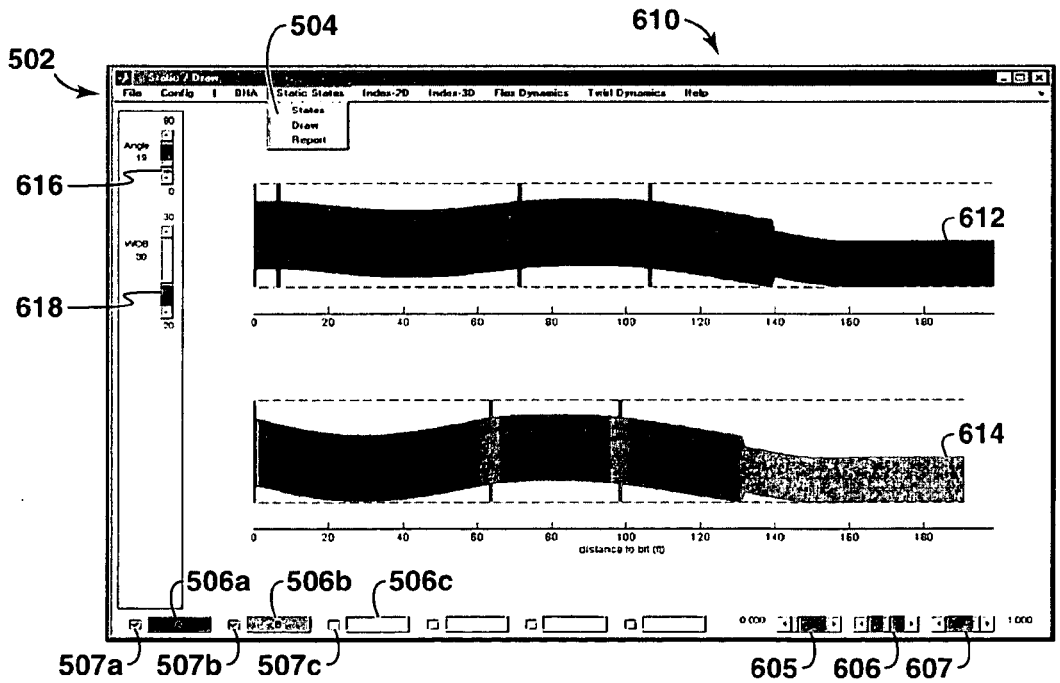

FIG. 6A is a screen view 600 of graphical displays 602 and 604 of the different BHA design configurations that is obtained by selecting the "BHA—Draw" menu 503. In this screen view 600, the BHA design configuration A and BHA design configuration B, which are accessed by selecting the BHA design tabs 506a-506b, are indicated as being graphically displayed by the indications in the virtual check boxes 507a and 507b. In particular, the graphical display 602 is associated with the BHA design configuration A and the graphical display 604 is associated with the BHA design configuration B. These graphical displays 602 and 604 represent the layout of the components of the respective designs.

In FIG. 6A, the virtual slider bars 605-607 may be utilized to adjust the view along various lengths of the BHA design configurations. In the present embodiment, virtual slider bars are shown as three separate slider elements, one to control the left or top edge of the window, one to control the right or bottom edge of the window, and a center slider element to allow the current window of fixed aperture to be moved along the respective dataset axes. Other slider bars are possible without deviating from this data processing functionality.

To proceed to the static calculations, the "Static States—Draw" menu tab 504 is selected from the menu bar 502. In FIG. 6B, screen view 610 may include graphical displays 612 and 614 of the different BHA design configurations. The graphical displays 612 and 614 present the static deflections experienced by the BHA design configurations due to axial loading and gravity. In this screen view 610, the graphical display 612 is associated with the BHA design configuration A and the graphical display 614 is associated with the BHA design configuration B. These graphical displays 612 and 614 illustrate the BHA lying on the low-side of the borehole, with the bit at the left end of the assembly. The virtual slider bars 605-607 and the BHA design tabs 506a-506b along with the virtual check boxes 507a and 507b may operate as discussed above in FIG. 6A. In addition, the virtual slider bars 616 and 618 may be utilized to adjust the WOB and inclination angle. In the present embodiment, when virtual slider bars 616, 618, and other similar components are adjusted, the corresponding values displayed in the "Config" panel of FIG. 5B are updated to synchronize various components of the modeling program that utilize the same dataset values. After being modified, other calculations of results and images use the updated values that have been selected.

Figure 6C:
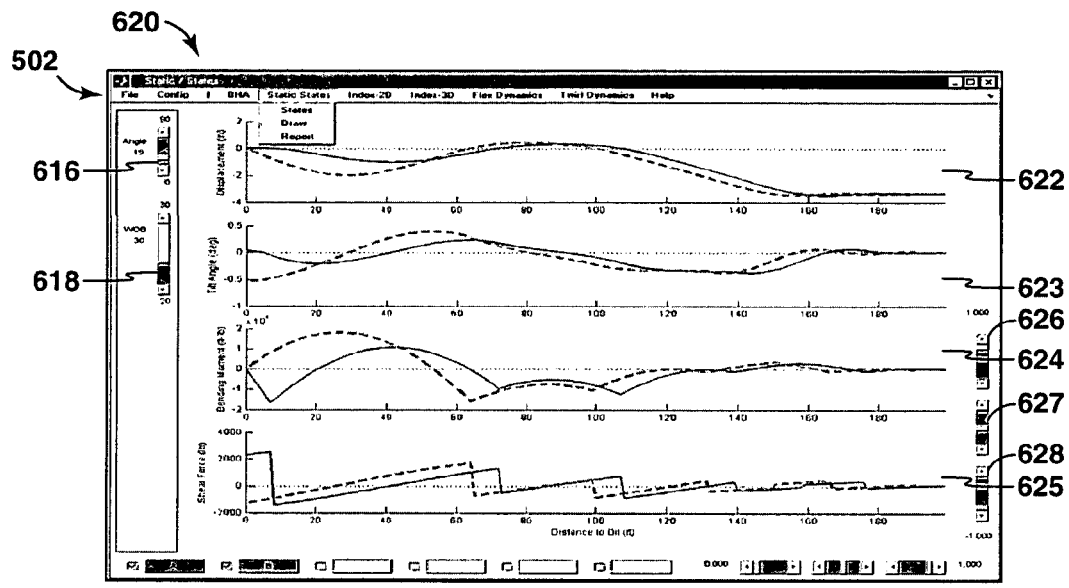

From the static states menu tab, the menu option labeled "States" may be selected from the menu bar 504 to provide the screen view 620 of FIG. 6C. In FIG. 6C, the screen view 620 presents the state values corresponding to the static model results of the BHA design configurations A and B corresponding to the deflections indicated in FIG. 6B. In particular, the graphical displays are the displacement display 622, a tilt angle display 623, a bending moment display 624, and a shear force display 625. The displays 622-625 present the BHA design configuration A as a solid line, while the BHA design configuration B is presented as a thicker dashed line. The BHA design configurations in the displays 622-625 are measured in inches (in) for displacement, degrees (deg) for tilt angle, foot-pounds (ft-lb) for bending moment, and pounds (lb) for shear force, and these values are plotted as a function of distance from the drill bit in feet (ft). If the modeling program units are specified in metric or other units, these values may be displayed in the respective units. The three vertical slider bars 626, 627, and 628 are used to zoom in to a specific range along the vertical axes of the graphs, with all four graphs being updated simultaneously as the sliders are adjusted.

In this example, the static sideforce values at the bit (distance to bit equals zero) are useful values. For instance, the BHA design configuration B has a small negative bit sideforce, which tends to drop the inclination angle, and the BHA design configuration A has a larger positive value, which tends to build the inclination angle. As WOB and inclination angle are varied, the updated values are presented and may be repeated by reselecting the desired action. Because the computations may take a specific amount of time to process and it may be necessary to change several parameters prior to requesting an update, the variation of input parameters in the modeling program may not result in recalculation of the results present on the screen without a user request. This provides the user with more control over the data presented. However, variations from this protocol are contemplated within the scope of the invention.

As may be appreciated, the above described static results are useful in determining if the BHA design configurations have the appropriate static values prior to proceeding into the dynamic analysis. For instance, the static results may indicate that the sideforce at the drill bit has a negative value, which is useful information for vertical wells. If the negative sideforce value is a "reasonable" value (e.g. several hundred to a thousand pounds for larger drill collars), the drilling operations utilizing the BHA design configuration may tend to reduce any increase in the wellbore or hole angle. This provides a stable BHA with a restoring force to preserve the vertical angle in the hole. However, if the sideforce value is increasingly positive for greater inclination angles, then the BHA may have a tendency to build angle. More generally, relationships have been derived in the industry between the BHA tendency to build or drop inclination angle and the states at the bit, namely the bit sideforce and tilt angle relative to the borehole centerline.

In addition to the static calculations and analysis, dynamic calculations may also be performed. For instance, two types of dynamic calculations may be referred to as the "flex" mode for flexural dynamic bending in the lateral plane and the "twirl" mode for whirling motion resulting from eccentric mass effects, as described in more detail above. These different dynamic calculations may be options provided on the menu bar 502 that can be invoked with the "Flex Dynamics" and "Twirl Dynamics" menu tabs, respectively.

Figure 6D:
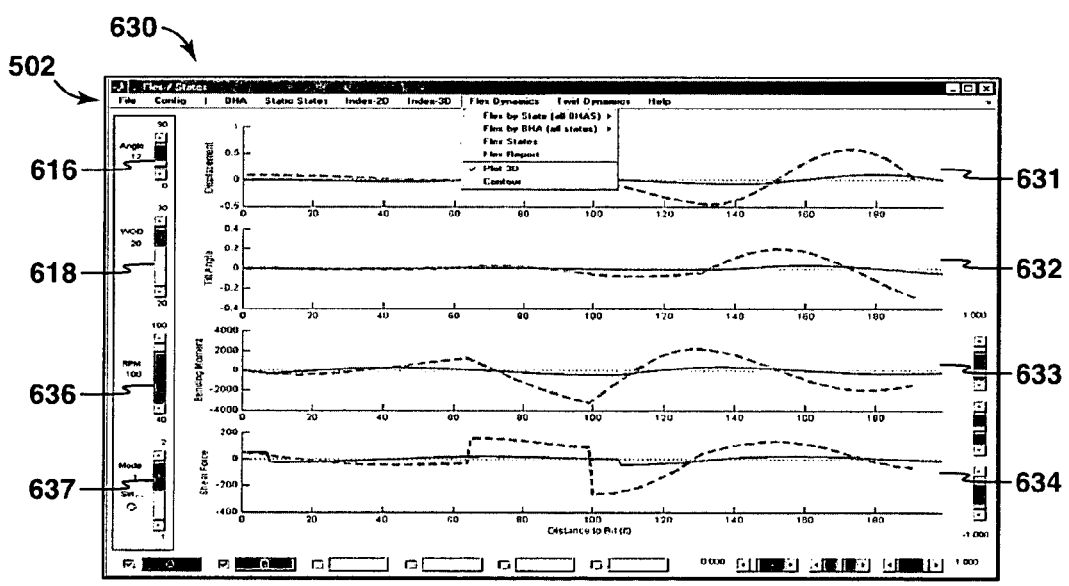

As an example, FIG. 6D is an exemplary screen view 630 of graphical displays 631-634 based on the flex lateral bending mode calculations in the flex dynamics mode. Screen view 630 is obtained by selecting "Flex Dynamics—Flex States" from the menu 502. These graphical displays are a displacement display 631, a tilt angle display 632, a bending moment display 633, and a shear force display 634. The displays 631-634 present the BHA design configuration A as a solid line, while the BHA design configuration B is presented as a thicker dashed line. The BHA design configurations in the displays 631-634 are calculated in inches (in) for displacement, degrees (deg) for tilt angle, foot-pounds (ft-lb) for bending moment, and pounds (lb) for shear force verses distance from the drill bit in feet (ft). However, the units are not displayed because these values are calculated for an arbitrary reference excitation input and are relative values in this sense.

More generally, the absolute values and corresponding units in the dynamic modes are not of significance because the objective of these calculations is to determine the relative quantitative values comparing two or more BHA designs. Thus, for the same excitation input, the relative response is to be determined for each BHA design configuration. In FIG. 6D, the dashed lines respond with higher amplitude than the solid line, and thus, for these conditions (e.g. 12 degrees of angle, 20 klb WOB, 100 RPM, and an excitation mode of one times the rotary speed), the BHA design configuration B has a tendency to vibrate more than the BHA design configuration A.

To adjust the displays 631-634, virtual slider bars, such as hole inclination slider bar 616, WOB slider bar 618, RPM slider bar 636, and excitation mode slider bar 637, may be utilized to adjust the operating parameters for the flex mode dynamic state calculations. For instance, as shown in FIG. 6D, the parameter values for the slider bars 616, 618, 636 and 637 are indicated by the values associated with the respective slider bars 616, 618, 636 and 637 (e.g. angle is 12°, WOB is 20 klbs, RPM is 100, and Mode is 1). The state vector responses (e.g. the lines on the graphical displays 631-634) are calculated for this set of operating parameters. Accordingly, if a comparative analysis for a different set of parameter values is desired, the slider bars 616, 618, 636 and 637 are used to adjust the parameters to another set of values to be modeled. The state vector responses may be recalculated and displayed for all the selected BHA design configurations.

Figure 6E:
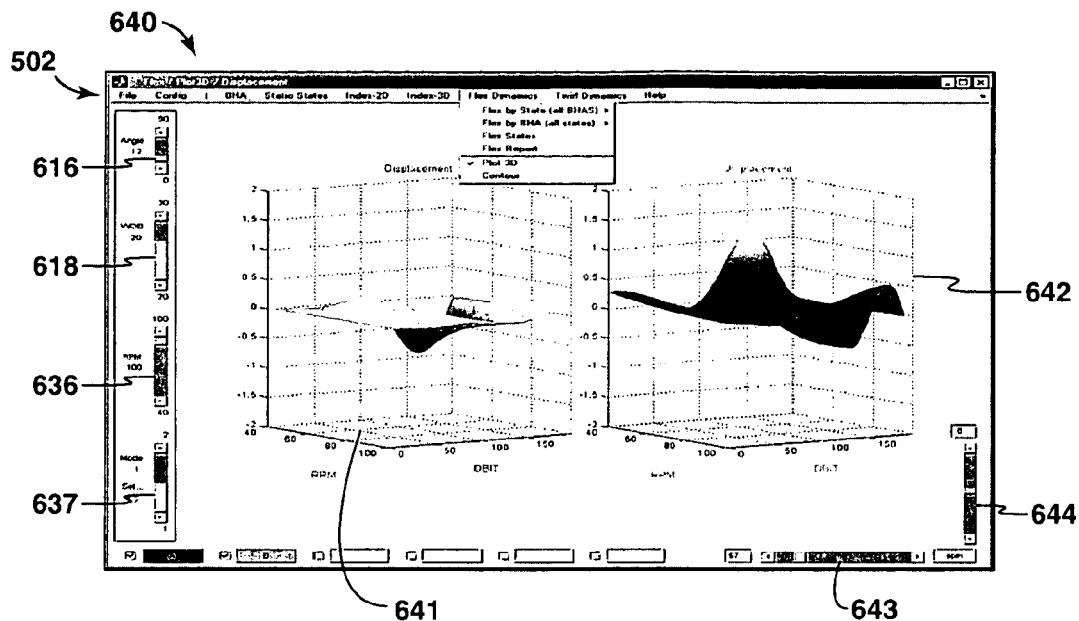

In addition to the 2-dimensional (2D) displays, the respective values or parameters may be used to generate 3-dimensional (3D) displays. For example, FIG. 6E is an exemplary screen view 640 of a 3D representation of the flex dynamics mode calculations that is obtained by checking the "Plot 3D" option on the menu bar 502. In this screen view 640, the graphical display 641 is of the BHA design configuration A and the graphical display 642 is of the BHA design configuration B. Each of the displays 641 and 642 present a 3D representation of the RPM ranges from the specified minimum to maximum values of parameters (e.g. angle is 12°, WOB is 20 klbs, and excitation mode is 1). For each of these selections, the state values plotted are selected from the list of displacement, tilt angle, bending moment, and shear force, selected from the menu that appears when "Flex Dynamics—Flex by State (all BHAS)" is chosen. The state variables are plotted versus distance from the bit, at the specific WOB, and with varying RPM. The axes of the displays 641 and 642 may be rotated in the same or identical manner for proper perspective. Further, the virtual slider bars, such as horizontal virtual slider bar 643 and vertical virtual slider bar 644, may be utilized to rotate the images for alternative perspectives. This is useful to visualize null response regions for which the vibrations are predicted to be low within an RPM range along the entire length of BHA.

Figure 6F:
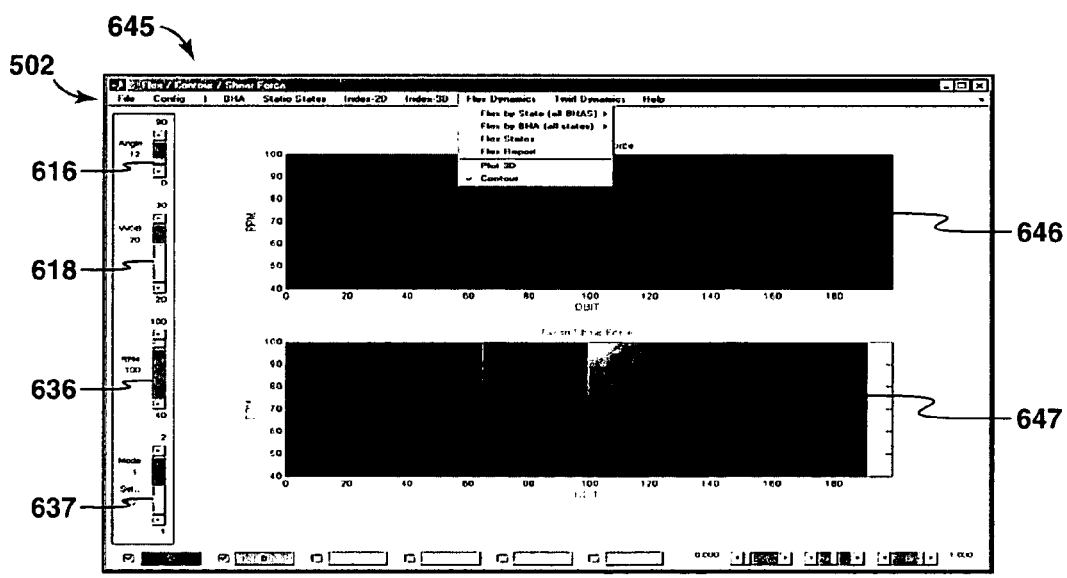

FIG. 6F is an exemplary screen view 645 of a 3D contour plot representation of the BHA design configurations in the flex dynamics mode, obtained by checking the "Contours" option from the flex dynamics menu option and then selecting the appropriate state variable to display. In this screen view 645, the graphical display 646 is of the BHA design configuration A and the graphical display 647 is of the BHA design configuration B. The data utilized to provide these displays 646 and 647 is the same data utilized in displays 641 and 642 of FIG. 6E. In this screen view 645, the contour shading for each of the displays 646 and 647 may be set to be identical so that the highest values are readily apparent by a visual inspection. The contour displays 646 and 647 present the state variable response amplitudes as a function of distance from the drill bit in feet on the x-axis versus rotary speed in RPM on the y-axis for the BHA design configurations A and B at the respective parameters. Alternatively, the axes may be swapped if desired.

Figure 6G:
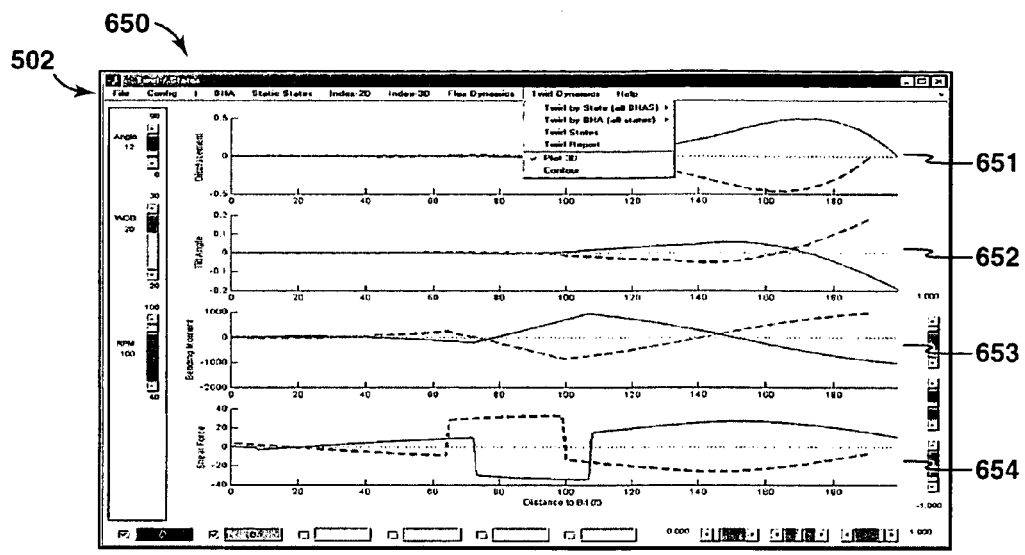
Figure 6H:
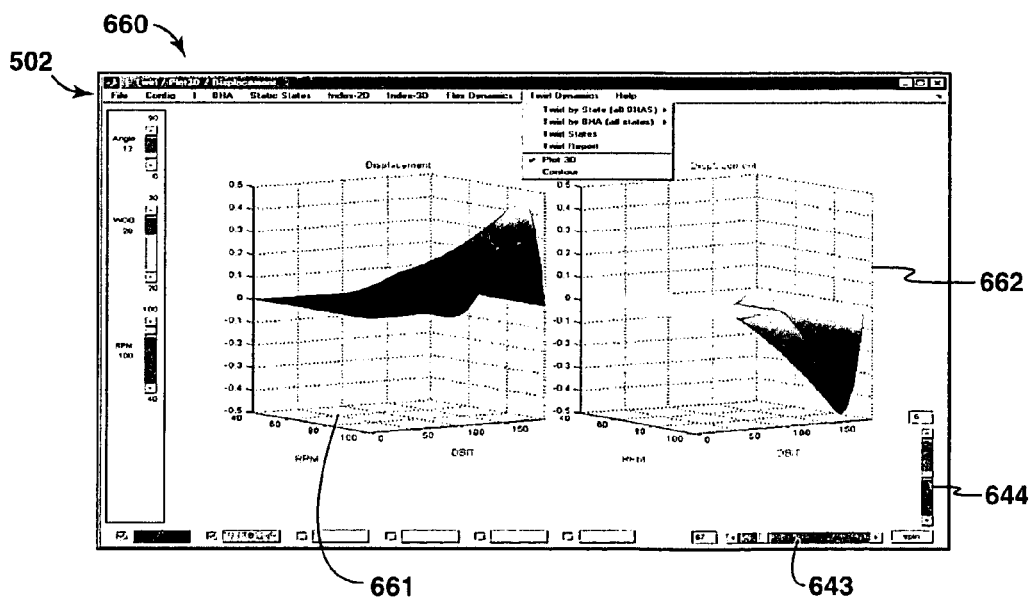
Figure 6I:
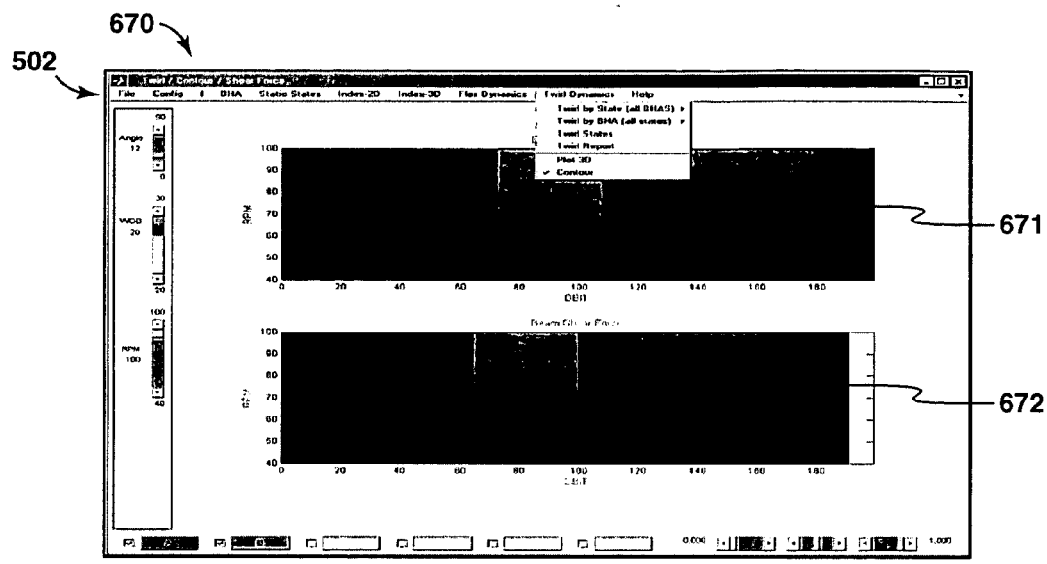

In addition to the flex dynamics mode calculations, twirl mode calculations may also be provided to assess the sensitivity of the BHA design configuration to eccentric mass effects, as shown in FIGS. 6G-6I. Because the twirl calculations apply to the eccentric mass loading conditions, which is synchronous with the rotary speed (i.e., occur only at one times the rotary speed), the FIGS. 6G-6I do not include excitation mode parameters (e.g. the mode slider bar 637). As one specific example of the twirl calculations, FIG. 6G is an exemplary screen view 650 of graphical displays 651-654 based on the twirl dynamics mode, obtained by selecting the "Twirl Dynamics—Twirl States" menu tab on the menu bar 502. In this screen view 650, the graphical displays are a displacement display 651, a tilt angle display 652, a bending moment display 653, and a shear force display 654. The displays 651-654 present the BHA design configuration A as a solid line, while the BHA design configuration B is presented as a thicker dashed line. The discussion regarding units for FIG. 6D is similar to discussion of FIG. 6G (e.g. the numerical values are meaningful on a relative, comparison basis).

FIG. 6H is an exemplary screen view 660 of a 3D representation of the BHA design configurations in the twirl mode by checking the "Plot 3D" menu option from the twirl dynamics menu tab and then choosing this display. In this screen view 660, the graphical display 661 is of the BHA design configuration A and the graphical display 662 is of the BHA design configuration B. Each of the displays 661 and 662 present a 3D representation of the RPM ranges from the specified minimum to maximum values (e.g., 40 to 100 RPM) for the BHA response along the length of the assembly, for the illustrated parametric values (e.g. inclination angle is 12° and WOB is 20 klbs). Just as in the example of FIG. 6E, the state values plotted are chosen from the list of displacement, tilt angle, bending moment, and shear force when the menu selection "Twirl Dynamics—Twirl by States (all BHAS)" is chosen. The axes of the displays 661 and 662 may be rotated in the same or identical manner for proper perspective. Further, the virtual slider bars, such as horizontal virtual slider bar 643 and vertical virtual slider bar 644, may be utilized to rotate the images in the displays 661 and 662 for alternative perspectives in a manner similar to the discussions above of FIG. 6E.

FIG. 6I is an exemplary screen view 670 of a 3D representation of the BHA design configurations in the twirl dynamics mode, obtained by checking the "Contours" tab menu option from the twirl dynamics menu tab, selecting the display "Twirl Dynamics—Twirl by States (all BHAS)," and choosing the state to view. In this screen view 670, the graphical display 671 is of the BHA design configuration A and the graphical display 672 is of the BHA design configuration B. The data utilized to provide these displays 671 and 672 is the same data utilized in displays 661 and 662 of FIG. 6H. In this screen view 670, the contour shading is again set to be identical so that the highest values are readily apparent by a visual inspection. The contour displays 671 and 672 present the state variable response amplitudes as a function of distance from the drill bit in feet on the x-axis versus rotary speed in RPM on the y-axis for the BHA design configurations A and B at the illustrated parameter values. Alternatively, the axes may be swapped if desired.

Figure 7A:
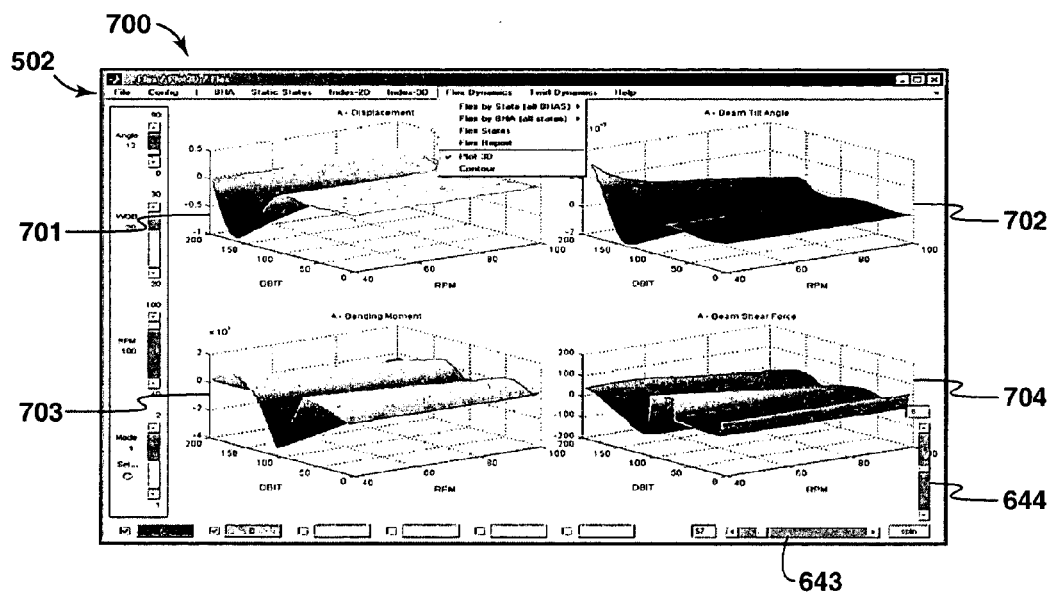
FIGS. 7A-7B are exemplary screen views provided by the modeling system of FIG. 3 utilized in a Design Mode to display a single constructed BHA design configuration in accordance with some aspects of the present techniques.

To display all states for a single BHA design configuration, the menu options "Flex Dynamics—Flex by BHA (all states)" may be selected from the menu bar 502, followed by selection of the specific BHA from a menu list. With "Plot 3D" selected, the screen view 700 of FIG. 7A is generated for the flex mode. Checking the "Contours" menu option and selecting this output will generate screen view 710 of FIG. 7B. In like manner, the corresponding 3D representations for the twirl mode may also be obtained.

In more detail, FIG. 7A is an exemplary screen view 700 of a 3D representation of the BHA design configuration A for the flex dynamics mode. In this screen view 700, the 3D graphical displays are a displacement display 701, a tilt angle display 702, a bending moment display 703, and a shear force display 704. Each of the displays 701-704 present a 3D representation of the states as functions of RPM and distance to the drill bit, for the respective parameter values of hole angle, WOB, and excitation mode. Note that the mode is not applicable to the twirl case. Accordingly, the displays 701-704 may be utilized to locate beneficial operating regions (e.g. operating parameter settings that reduce vibrations) for the candidate BHA design configurations and to examine the relationships between the state variables for a given BHA design configuration. Further, the virtual slider bars, such as horizontal virtual slider bar 643 and vertical virtual slider bar 644, may be utilized to rotate the images for alternative perspectives, as described above.

Figure 7B:
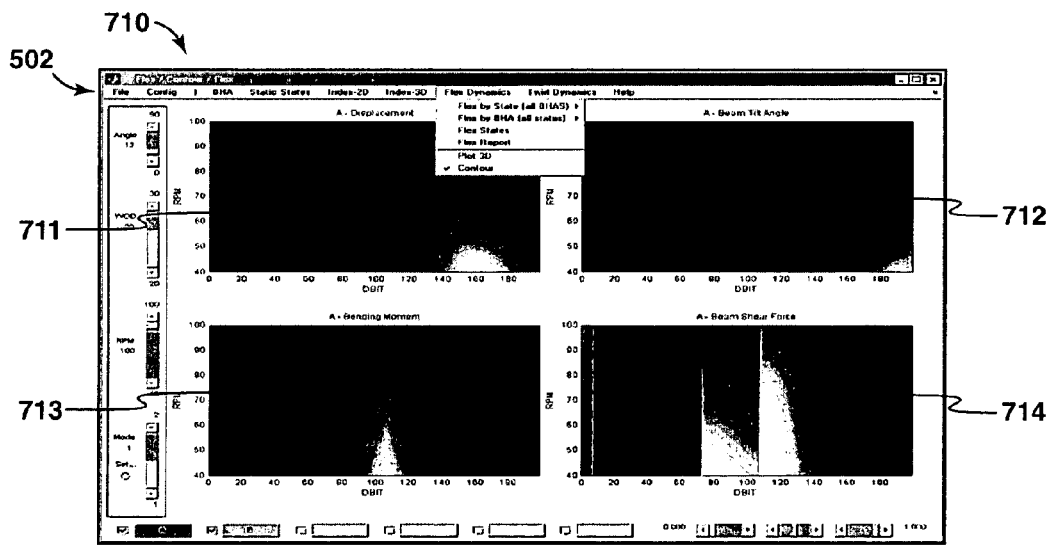

FIG. 7B is an exemplary screen view 710 of a contour map representation for the selected BHA design configuration in the flex or twirl dynamics mode, as appropriate. This display is obtained by checking the "Contours" option on the menu bar 502 and then selecting the appropriate menu item for the flex and twirl modes. In this screen view 710, the 3D graphical displays are a displacement display 711, a tilt angle display 712, a bending moment display 713, and a shear force display 714. Each of the displays 711-714 may be based on the same data utilized in displays 701-704 of FIG. 7A.

Figure 8A:
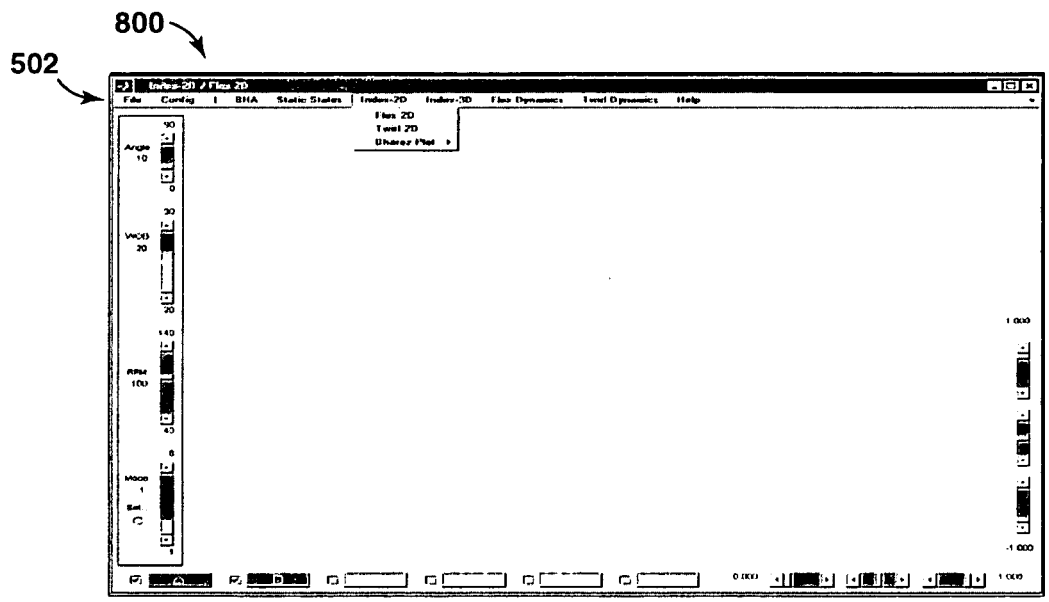
FIGS. 8A-8E are exemplary screen views provided by the modeling system of FIG. 3 utilized in a Design Mode to display vibration performance index results in accordance with some aspects of the present techniques.
Figure 8B:
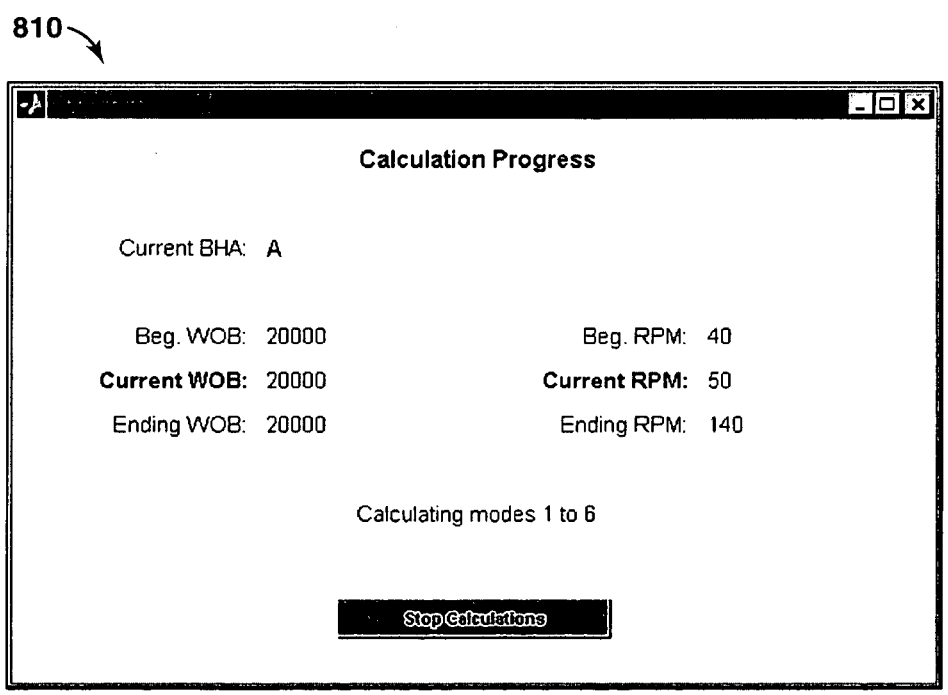

Selection of the "Index 2D" menu tab on the menu bar 502 provides the additional menu options "Flex 2D," "Twirl 2D," and "Bharez Plot," as illustrated in screen view 800 of FIG. 8A. Selection of one of these menu options may cause the information panel 810 illustrated in FIG. 8B to be displayed while the index calculations are performed (typically no more than a few minutes). The calculations or simulations are performed for the inclination angle and WOB indicated, for the specified RPM range and excitation mode range requested, for each of the selected BHA configurations. After each simulation run for a given parameter set, the results are saved in memory and may be utilized to calculate the dynamic vibration performance or the indices as described above. When the calculations have been completed, FIG. 8B is closed and the performance index results for the flex mode lateral bending output is provided by default, as seen in display 820 of FIG. 8C. The menu options of "Flex 2D" and "Twirl 2D" may be subsequently used to display these results, and the "Bharez Plot" menu option may be used to display only the end-point curvature index value for compatibility with a prior modeling program.

Figure 8C:
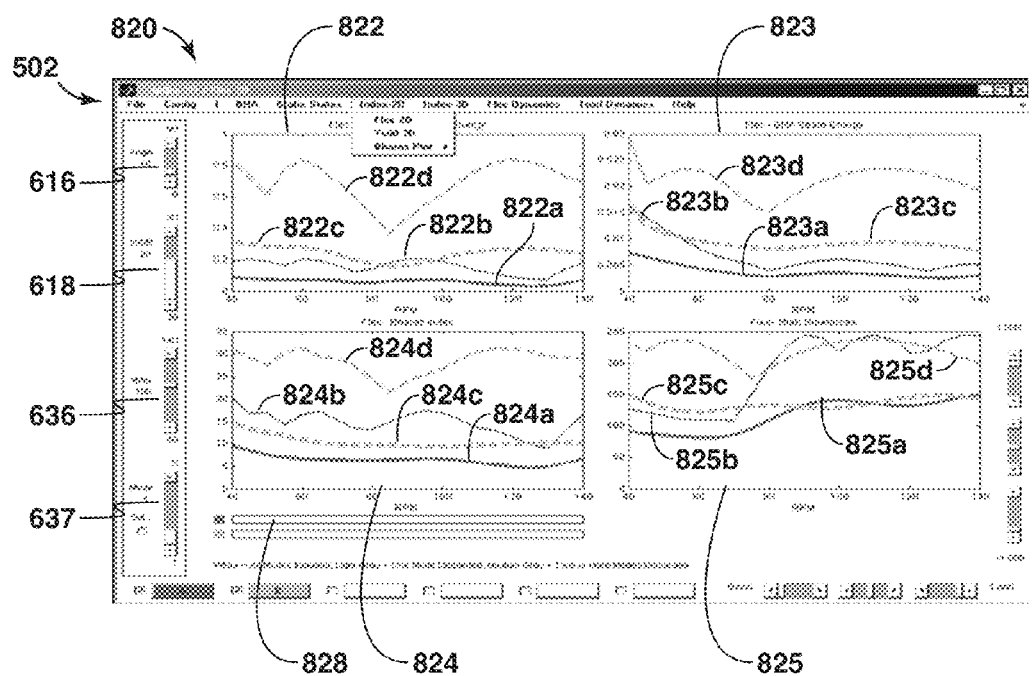

Once the calculations are completed, vibration index results or responses as a function of rotary speed are presented in a screen view 820 of FIG. 8C. In this screen view 820, four vibration performance indices 822-825 are shown against values of RPM for a fixed WOB of 20 klbs and using modes up to 6. Referring back to the performance index calculations discussed above, the vibration index response 822 corresponds to the RMS Transmitted Strain Energy Index values; vibration index response 823 represents results for the BHA Strain Energy Index values; vibration index response 824 corresponds to the RMS End-Point Curvature Index values; and finally vibration index response 825 represents the RMS BHA Stabilizer Sideforce Index values or, alternatively, one of the BHA Dynamic Torque Index values. In these displays, the lines 822a, 822b, 823a, 823b, 824a, 824b, 825a and 825b correspond to results for BHA design configuration A, and the lines 822c, 822d, 823c, 823d, 824c, 824d, 825c and 825d indicate results for BHA design configuration B. Furthermore, the heavier lines ("a" and "c") are the RMS values averaged over the various excitation mode and end-length calculations for the flex mode (recall that the twirl mode is only calculated for the excitation mode of one times the rotary speed), and the thinner lines ("b" and "d") indicate the "worst case" maximum index results. If the excitation is self-sustained at the worst case condition, then this value is a measure of how detrimental that condition may be to the BHA. In these charts 822-825, it may be noted that results for the BHA design configuration A are generally lower than those for the BHA design configuration B. Thus, it is expected that BHA design configuration A should exhibit lower vibrational response than BHA design configuration B because the response for BHA A is lower than that for BHA B for the similar bit excitation conditions (i.e., the same applied dynamic bit loads and excitation modes).

The set of horizontal bars 828 in FIG. 8C are a diagnostic aid to examine if any numerical convergence difficulties have been encountered for any of the excitation modes. The tag, which may be colored, to the left of the bars 828 indicates which BHA the respective bars 828 represent. If the bar is all white (as shown in this example), then all of the requested modes processed to completion successfully. If shaded light gray, then one mode (generally the highest excitation mode level) failed to converge and the non-converged mode is omitted from the results. If shaded dark gray, then two or more modes were omitted, and the user is thereby warned that some investigation is necessary to modify parameters to restore convergence.

For flex dynamics mode calculations, the RMS and maximum values are based on the various combinations of modes and end-lengths, but for twirl dynamics calculations the RMS and maximum values are based on the various end-lengths only. The resulting index values for a range of rotary speeds of the graphical displays 822-825 indicate the operating conditions, and through visual inspection provide the specific efficient operating range or "sweet spot" of the BHA design configurations. This efficient operating range may be found as an interval of 5-10 RPM (or more) for which the response is close to a minimum. Some examples present stronger minimum response tendencies than others. In this example, the BHA design configuration A is preferred to BHA design configuration B across the full RPM range. If BHA design configuration B is used, there may be a preferred region around 80 RPM where the RMS Transmitted Strain Energy index 822c curve has a slight dip.

Figure 8D:
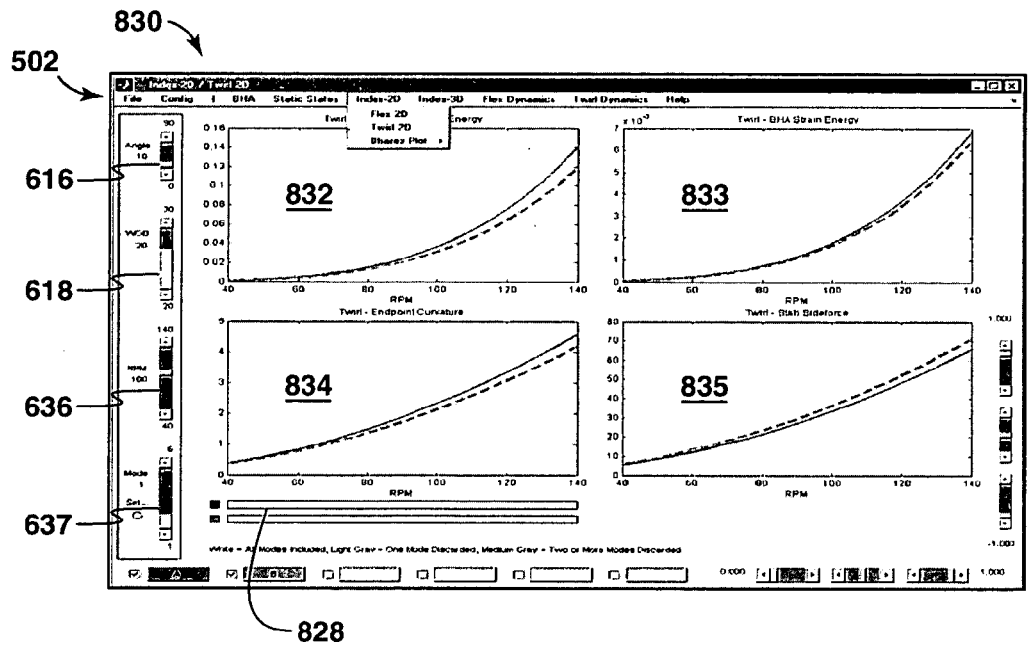

The results for the twirl mode calculations are displayed in screen view 830 of FIG. 8D for which the corresponding index calculations are shown. In screen view 830, the vibration index response 832 corresponds to the RMS Transmitted Strain Energy Index values; vibration index response 833 illustrates represents the BHA Strain Energy Index values; vibration index response 834 corresponds to the RMS End-Point Curvature Index values; and finally vibration index response 835 refers to the RMS BHA Sideforce Index values or, alternatively, one of the BHA Dynamic Torque Index values. FIG. 8D shows how quadratic this model response shape may be. The matrix element for the eccentric mass includes the rotary speed squared as a direct force input as described above.

Figure 8E:
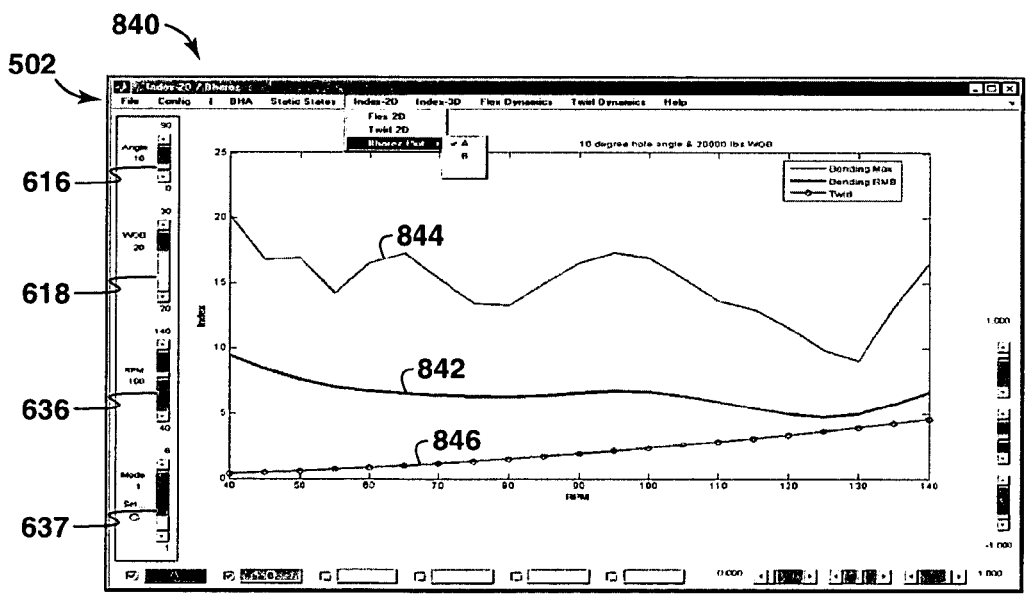

Results for specific individual BHA configuration results may be enlarged to fill the available screen area, as shown in screen view 840 in FIG. 8E. In screen view 840, the End-Point Curvature Index is displayed for BHA design configuration A. This was obtained by selecting the "Bharez Plot" menu option in menu bar 502. The RMS flex mode index values are plotted as response 842, the maximum flex mode values are represented by response 844, and the RMS twirl values are provided in response 846.

In addition to the lateral vibration index displays, comparable index values for other modes, such as axial and torsional vibrations, may also be provided. Accordingly, it should be appreciated that comparable displays of vibration indices may be provided to facilitate comparison of vibration tendencies among different BHA design configurations, as well as to compare the responses at different frequencies of other vibration modes. For example, this modeling program may be utilized to provide BHA design configurations having efficient operating ranges with low levels of vibration response at all modes, including flexural, twirl, whirl, axial, and torsional responses. Combination of the present techniques with other models known in the art is likely a useful extension of this technique, and such is included within the broader method disclosed herein.

Figures 9A, 9B:
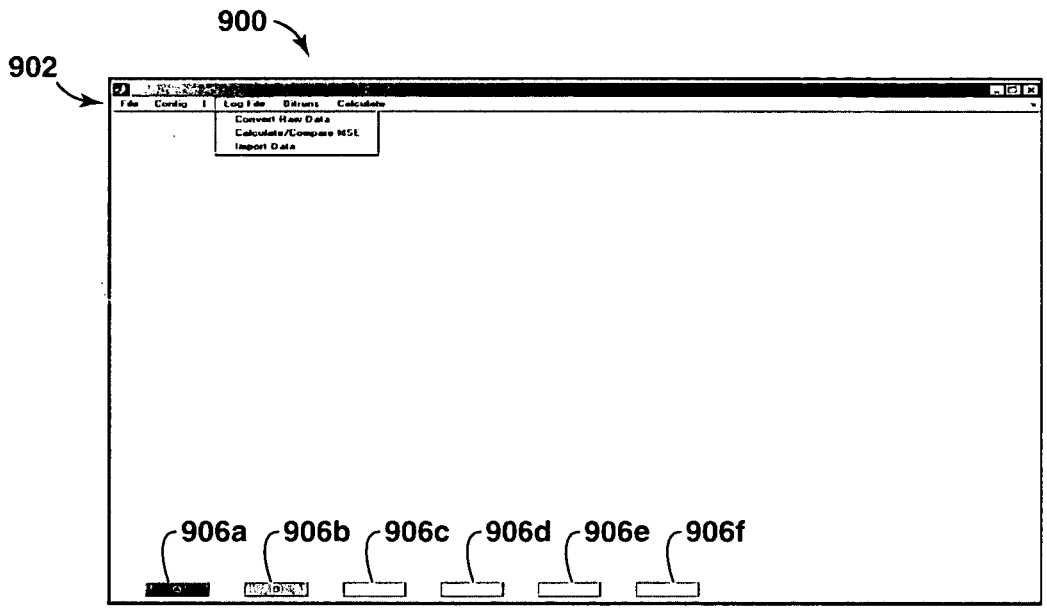
FIGS. 9A-9D are exemplary screen views provided by the modeling system of FIG. 3 utilized in a Log Mode in accordance with some aspects of the present techniques.

The second application method, the "Log Mode" may be accessed from the screen view 400 by selecting the second virtual button 404 of FIG. 4. If the log mode is selected, a screen view 900 of a blank panel is presented, as shown in FIG. 9A. The menu tabs in the menu bar 902 are a file menu tab, which is labeled "File" for printing, print setup, and exiting. The configuration menu tab, which is labeled "Config," invokes the configuration panel 510 illustrated in FIG. 5B. As discussed above, in an alternate embodiment, the configuration information may include rate of change of inclination or azimuth angles and, more generally, wellbore survey data to evaluate drilling dynamic response for varying wellbore geometry. Menu 902 includes: a "Log File" menu option to setup an input dataset from field operational data inputs such as that illustrated in FIG. 9B and as discussed below; a menu tab labeled "Bitruns" to invoke a panel to define BHA depth in and depth out, as shown in FIG. 9C; and a calculate menu tab, which is labeled "Calculate."

Also shown in this screen view 900, virtual buttons 906a-906f may be utilized to access the different BHA design configurations, which is similar to the discussion above. In this example, two BHA design configurations, which are "A" associated with virtual button 906a and "B" associated with virtual button 906b are configured, while virtual buttons 906c-906f do not have BHA design configurations associated with them. These buttons perform the identical function as buttons 506a-f of FIG. 5A.

To import log data, an input file is selected using the Log File menu tab to obtain the preformatted data. As shown in FIG. 9B, a screen view 910 presents the log data sorted into various columns of text boxes 912. In particular, for this example, the log data is sorted into columns of depth, WOB, RPM, ROP, and MSE text boxes. The data in these different text boxes may be organized in a specific file format, such as Microsoft Excel™. The log data may include a sequential index (depth or time), WOB, and RPM in preferred embodiments. In addition, in this screen view 910, additional data, such as ROP (drilling rate) and Mechanical Specific Energy (MSE), are also provided. After the modeling program obtains the preformatted data, the variables (e.g. WOB, RPM, ROP, MSE, etc.) may be plotted versus depth. However it should be noted that in different implementations, different data sets of log data may be available for comparison with predicted values. For instance, the other data sets may include downhole or surface measurements of vibrations, formation or rock property data, well log data, mud log data, as well as any other parameter that is provided as a function of depth and/or time. In the preferred embodiment, the menu tabs may include menu options that access processes to directly convert raw field data from one of the vendor-supplied formats to a compatible format, calculate the MSE data from the raw inputs and compare with the MSE data generated in the field, and import a dataset that has been converted from field data to a format similar to 910 for entry into the subject modeling program.

Figure 9C:
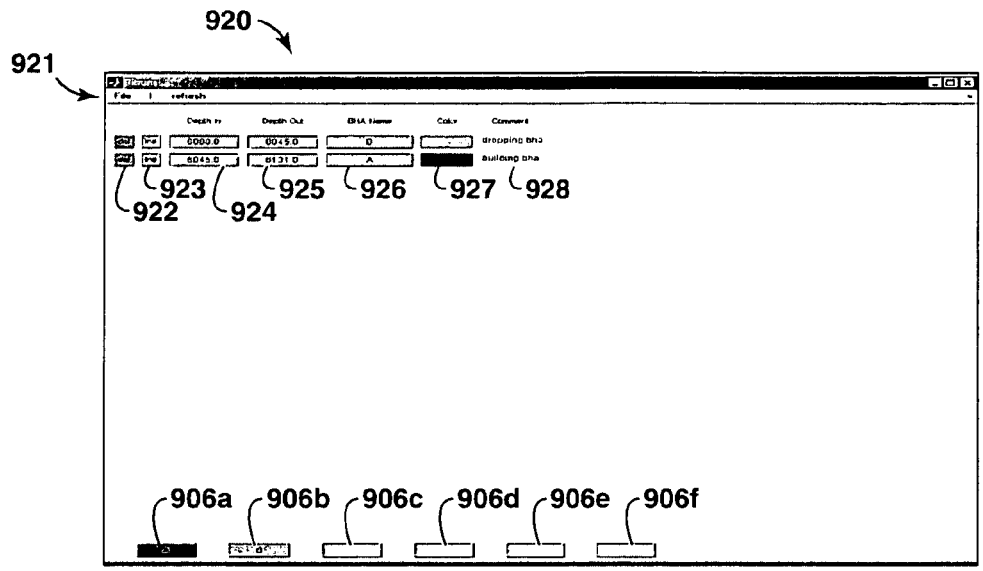

Then, the "Bitruns" menu tab of menu bar 902 may be selected to associate the imported log data with a BHA design configuration for each depth interval, as shown in FIG. 9C. In FIG. 9C, a screen view 920 of the "Bitruns" data panel is provided. The screen view 920 may include a menu bar 921 along with virtual buttons 906a-906f, which open BHA description panels similar to those discussed above in FIGS. 5C and 5D. Accordingly, by using these virtual buttons, each of the BHA design configurations may be viewed, updated, or created.

Screen view 920 includes virtual buttons to add and delete bitrun line entries, such as insert virtual buttons 922 labeled "ins" and delete virtual buttons 923 labeled "del." The virtual buttons 922 and 923 provide a mechanism to modify the bitrun depth intervals, the assignment of BHA layout configurations to specific depth intervals, and otherwise control the calculations that will be conducted in the next processing step. For example, the depth range text boxes, such as depth in text boxes 924 labeled "Depth In" and depth out text boxes 925 labeled "Depth Out," may be entered for each of the BHA design configurations that were run in the field so that the relevant design is associated with the corresponding field operational data measurements. Further, the screen view 920 includes buttons 926 to select the specific BHA design configuration for each line entry, illustrate the designated color (e.g. "light gray" or "dark gray") as shown in color text boxes 927. Furthermore, screen view 920 includes an area to display the associated comment text boxes 928.

Figure 9D:
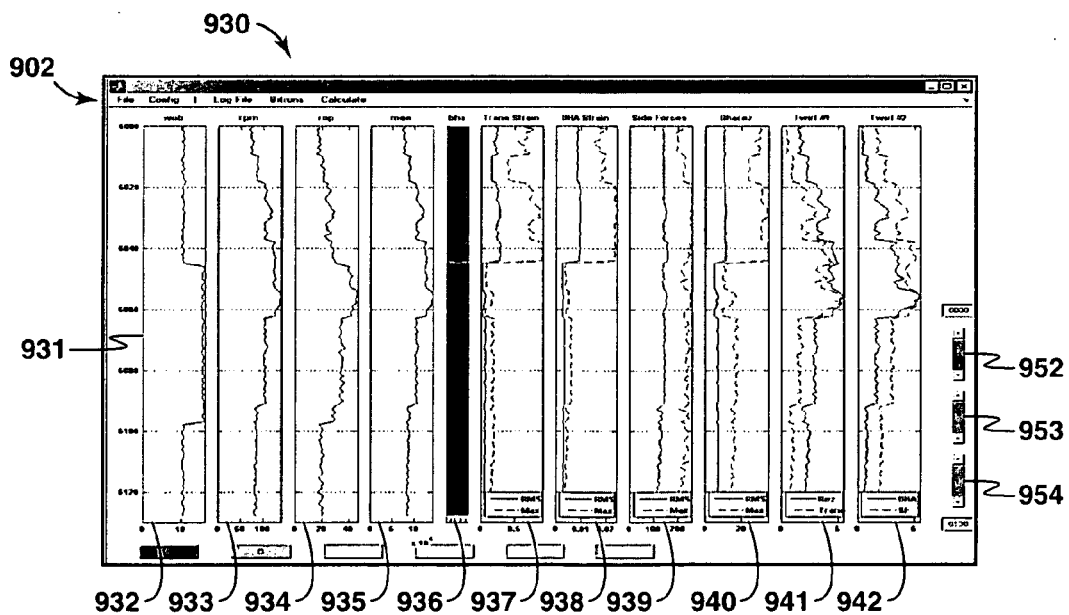

Once configured, the "Calculate" menu tab may be selected from the menu bar 902. When the calculate menu tab is selected, the model predictions are driven by operating parameters from the imported log data, using the respective BHA design configuration for each interval. The resulting dynamic vibration performance indices may be displayed when the calculations have been completed or as they are generated. An example of this graphical display is provided in FIG. 9D. In FIG. 9D, a screen view 930 presents predicted model results plotted alongside other field values, with a solid colored bar 936 to illustrate the BHA design configuration selected for each depth interval. That is, the log-based processing provides diagnostic displays 932-935 of the representative operating and measured parameters (e.g. applied WOB 932 in klbs, applied rotary speed 933 in RPM, ROP response 934 in ft/hour, and MSE response 935 in units of stress). These values are plotted versus depth, which is displayed along the vertical axis 931. The various vibration performance indices for the flexural lateral bending mode calculations are shown to the right of the BHA selection bar 936, such as: the Transmitted Strain Energy Index 937, the BHA Strain Energy Index 938, the BHA Sideforce Index 939, and the End-Point Curvature Index (i.e. "Bharez") 940. The four corresponding index values for the twirl mode calculations are displayed in 941 and 942. The virtual slider bars 952-954 allow the depth interval in the displays to be adjusted.

Plotting the predicted results in a log format provides insight into the vibration status of the drilling assemblies and facilitates understanding of the model results versus the measured log data. Accordingly, it models conditions experienced within a wellbore to increase or decrease vibrations. In addition, the present techniques provide graphical displays of vibration levels that are reflected in changes in parameters, such as ROP, MSE, and any vibration measurements acquired in the field. Additional data provided may include well log data, formation properties, sonic travel times, lithology, any derived parameters such as formation hardness or stress values calculated from dipole sonic logs, etc. Additional vibration index predictions may also include axial, torsional and/or stick-slip vibration modes that may be provided by any conventional models known to the industry.

Beneficially, the modeling program in the log mode and methods described above may be utilized to provide greater insight into the operation of BHA assemblies within a wellbore. Indeed, experience gained with application of the modeling design tools described herein will provide information and insights regarding vibration control methods obtained via modification to BHA design practice. These learnings will be in the form of improved understanding of preferred configurations to avoid vibration generation, as well as practices regarding use of specialized drilling equipment such as under-reamers, roller reamers, rotary steerable equipment, bi-center and other types of new bits, new stabilizers, different material compositions, and other improved drilling equipment. Application of these quantitative design techniques will allow the industry to progress beyond educated guesses of BHA dynamic performance to evolve practices using comparative analysis of alternative BHA designs.

In one embodiment, this process may be utilized with flow chart 100 of FIG. 1. As a specific example, in block 112 of FIG. 1, the measured data may be compared with calculated data for a selected BHA design configuration. Then, a redesign of the BHA design configuration may be performed with one or more additional BHA design configurations. These additional BHA design configurations may include various enhancements that are tailored to address certain limiters indicated from the measured data, such as the MSE data, ROP, WOB, stick-slip, or vibrational data. Then, one of the BHA design configurations may be selected for use in drilling the well. In this manner, the limiter may be removed or reduced to increase the ROP of drilling operations.

While the present techniques of the invention may be susceptible to various modifications and alternative forms, the exemplary embodiments discussed above have been shown by way of example. However, it should again be understood that the invention is not intended to be limited to the particular embodiments disclosed herein. Indeed, the present techniques of the invention are to cover all modifications, equivalents, and alternatives falling within the spirit and scope of the invention as defined by the following appended claims.

What is claimed is:

1. A method of modeling drilling equipment comprising:
  constructing two or more differing design configurations, wherein each of the design configurations represents at least a portion of a bottom hole assembly (BHA);
  identifying operating parameters for the two or more differing design configurations;
  selecting mathematical boundary conditions wherein the two or more differing design configurations are subjected to identical system excitation;
  calculating lateral beam bending results using a computer processor accessing non-transitory computer readable media, for each of the two or more differing design configurations using a model that includes the identified operating parameters and the selected mathematical boundary conditions calculating, using the computer processor accessing non-transitory computer readable media, for each of the two or more differing design configurations using a model that includes the identified operating parameters and the selected mathematical boundary conditions, one or more performance indices that characterize a determined BHA vibration performance of the two or more differing design configurations, wherein the one or more performance indices comprise at least one of an end-point curvature index, a BHA strain energy index, an average transmitted strain energy index, a transmitted strain energy index, a root-mean-square BHA sideforce index, a root-mean-square BHA torque index, a total BHA sideforce index, a total BHA torque index, and any mathematical combination thereof;
  comparing the calculated results for the two or more differing design configurations; and
  displaying the calculated results of at least one of the two or more differing design configurations.

2. The method of claim 1 further comprising verifying the two or more differing design configurations by graphically displaying the two or more differing design configurations on the same display.

3. The method of claim 1 wherein constructing the two or more differing design configurations comprises:
  constructing two or more design layouts;
  associating operating parameters and mathematical boundary conditions with the two or more design layouts; and associating equipment parameters with each of the two or more design layouts to create the two or more differing design configurations.

4. The method of claim 1 wherein calculating the results for two or more differing design configurations comprises:
generating a mathematical lateral beam bending model for each of the two or more differing design configurations;
calculating the results of the mathematical model for specified operating parameters and identical mathematical boundary conditions;
identifying displacements, tilt angle, bending moment, and beam shear force from the results of the mathematical model; and
determining state vectors and matrices from the identified outputs of the mathematical model.

5. The method of claim 4 wherein a two-dimensional or three-dimensional finite element model is used to calculate model results, from which state vectors and matrices may be identified.

6. The method of claim 4 wherein calculating the results of each of the two or more differing design configurations comprises:
generating a lumped parameter model of each of the two or more differing design configurations, wherein the lumped parameter model has a framework of state vector responses and matrix transfer functions;
determining a mass element transfer function and a beam element transfer function; and
determining identical mathematical boundary conditions and system excitation to generate the model results.

7. The method of claim 4 further comprising determining one or more performance indices comprising a scalar quantity derived from the state vectors and matrices, so obtained for each set of mathematical boundary conditions and system excitation.

8. The method of claim 1 wherein the operating parameters and the mathematical boundary conditions comprise a first modeling set of operating parameters and mathematical boundary conditions and a second modeling set of operating parameters and mathematical boundary conditions, both of the first set and second set of operating parameters and mathematical boundary conditions is used to model at least one of dynamic lateral bending and eccentric whirl.

9. The method of claim 1 further comprising selecting one of the two or more differing design configurations based on the calculated results.

10. The method of claim 1 wherein the calculated results comprise state variable values.

11. The method of claim 1 wherein the calculated results are displayed as three dimensional responses.

12. The method of claim 11 wherein the three dimensional responses are rotated based on movement of one or more virtual slider bars.

13. The method of claim 1, wherein the end-point curvature index is defined by the equation:

$$PI = \alpha \frac{M_N}{(EI)_N}$$

wherein PI is the end-point curvature index, $M_N$ is the bending moment at the last element in each of the design configurations, $(EI)_N$ is the bending stiffness of each such element, and $\alpha$ is a constant.

14. The method of claim 1, wherein the BHA strain energy index is defined by the equation:

$$PI = \frac{1}{L} \sum_{i=1}^{L} \frac{M_i^2}{2(EI)_i}$$

wherein PI is the BHA strain energy index, L is the last element index in a lower section of each of the design configurations, i is the element index in each of the design configurations, $M_i$ is the bending moment of the $i^{th}$ element in each of the design configurations, and $(EI)_i$ is the bending stiffness of the $i^{th}$ element.

15. The method of claim 1, wherein the average transmitted strain energy index is defined by the equation:

$$PI = \frac{1}{(N - U + 1)} \sum_{i=U}^{N} \frac{M_i^2}{2(EI)_i}$$

wherein PI is the average transmitted strain energy index, i is the element index in the each of the design configurations, $M_i$, is the bending moment of the $i^{th}$ element in each of the design configurations, $(EI)_i$, is the bending stiffness of the $i^{th}$ element, N is the total number of elements and U is the first element of the upper part of each of the design configurations.

16. The method of claim 1, wherein the transmitted strain energy index is defined by the equation:

$$PI = \frac{\left(\max_{i=U}^{N}(M_i) - \min_{i=U}^{N}(M_i)\right)^2}{16(EI)_N}$$

wherein PI is the transmitted strain energy index, i is the element index in each of the design configurations, $M_i$, is the bending moment of the $i^{th}$ element in each of the design configurations, $(EI)_N$ is the bending stiffness of each element in the upper part of each of the design configurations, N is the total number of elements and U is the first element of the upper part of each of the design configurations.

17. The method of claim 1, wherein the root-mean-square BHA sideforce index is defined by the equation:

$$PI = \sqrt{\frac{1}{C} \sum_{j=1}^{C} F_j^2}$$

wherein PI is the root-mean-square BHA sideforce index, j is the element index of the contact points between each of the design configurations and a modeled wellbore, C is the number of such contact points, and $F_j$ is the contact force.

18. The method of claim 1, wherein the total BHA sideforce index is defined by the equation:

$$PI = \sum_{j=1}^{C} |F_j|$$

wherein PI is the total BHA sideforce index, j is the element index of the contact points between each of the design configurations and a modeled wellbore, C is the number of such contact points, and $F_j$ is the contact force.

19. The method of claim 1, wherein the root-mean-square BHA torque index is defined by the equation:

$$PI = \sqrt{\frac{1}{C}\sum_{j=1}^{C}(\mu_j r_j F_j)^2}$$

wherein PI is the root-mean-square BHA torque index, j is the element index of the contact points between each of the design configurations and a modeled wellbore, C is the number of such contact points, $F_j$ is the contact force, $r_j$ is the radius to the contact point for the applied moment arm and $\mu_j$ is the appropriate coefficient of friction at each respective contact point.

20. The method of claim 1, wherein the total BHA torque index is defined by the equation:

$$PI = \sum_{j=1}^{C}|\mu_j r_j F_j|$$

wherein PI is the total BHA torque index, j is the element index of the contact points between each of the design configurations and a modeled wellbore, C is the number of such contact points, $F_j$ is the contact force, $r_j$ is the radius to the contact point for the applied moment arm and $\mu_j$ is the appropriate coefficient of friction at each respective contact point.

21. The method of claim 1 wherein the root-mean-square (RMS) average of the one or more performance indices is defined by the equation:

$$PI' = \sqrt{\frac{1}{mn}\sum_{i=1}^{m}\sum_{j=1}^{n}(PI)_{ij}^2}$$

wherein PI' is the RMS average of a selected performance index, j is an element index, i is an element index, m is the number of excitation modes, n is the number of BHA end-lengths, and $(PI)_{ij}$ is one of the one or more performance indices for the $i^{th}$ index of the m modes and $j^{th}$ index of the n BHA end-lengths in the BHA design configuration.

22. The method of claim 1 wherein the maximum of the one or more performance indices is defined by the equation:

$$PI' = \max_{i=1}^{m}\left\{\max_{j=1}^{n}(PI)_{ij}\right\}$$

wherein PI' the maximum value of a selected performance index, j is an element index, i is an element index, m is the number of excitation modes, n is the number of BHA end-lengths, and $(PI)_{ij}$ is one of the one or more performance indices for the $i^{th}$ index of the m modes and $j^{th}$ index of the n BHA end-lengths in the BHA design configuration.

23. A method of modeling drilling equipment comprising:
constructing two or more differing design configurations representing a portion of a bottom hole assembly (BHA);
identifying operating parameters and mathematical boundary conditions;
determining BHA vibration performance of the two or more design configurations using a model that includes the identified operating parameters and the identified mathematical boundary conditions, wherein each of the two or more differing design configurations is subjected to identical excitation for all operating parameters;
calculating using a computer processor accessing non-transitory computer readable media, one or more performance indices that characterize the determined BHA vibration performance of the two or more design configurations, wherein the one or more performance indices comprise at least one of an end-point curvature index, a BHA strain energy index, an average transmitted strain energy index, a transmitted strain energy index, a root-mean-square BHA sideforce index, a root-mean-square BHA torque index, a total BHA sideforce index, a total BHA torque index, and any mathematical combination thereof; and
displaying at least one of the calculated one or more performance indices of the two or more differing design configurations.

24. The method of claim 23 wherein the one or more performance indices comprise at least two performance indices.

25. The method of claim 23 wherein constructing the two or more differing design configurations comprises:
constructing a design layout;
associating equipment parameters with the design layout to form the two or more differing design configurations; and
associating specific operating parameters and mathematical boundary conditions with the at least two or more differing design configurations.

26. The method of claim 23 wherein the calculated one or more performance indices are displayed as three dimensional responses.

27. The method of claim 26 wherein the three dimensional responses are rotated based on movement of one or more virtual slider bars.

28. The method of claim 23, wherein the end-point curvature index is defined by the equation:

$$PI = \alpha\frac{M_N}{(EI)_N}$$

wherein PI is the end-point curvature index, $M_N$ is the bending moment at the last element in a design configuration, $(EI)_N$ is the bending stiffness of each such element, and $\alpha$ is a constant.

29. The method of claim 23, wherein the BHA strain energy index is defined by the equation:

$$PI = \frac{1}{L}\sum_{i=1}^{L}\frac{M_i^2}{2(EI)_i}$$

wherein PI is the BHA strain energy index, L is the last element in a lower section of a design configuration, i is the element index in a design configuration, $M_i$ is the bending moment of the $i^{th}$ element in a design configuration, and $(EI)_i$ is the bending stiffness of the $i^{th}$ element.

30. The method of claim 23, wherein the average transmitted strain energy index is defined by the equation:

$$PI = \frac{1}{(N-U+1)} \sum_{i=U}^{N} \frac{M_i^2}{2(EI)_i}$$

wherein PI is the average transmitted strain energy index, i is the element index in a design configuration, $M_i$ is the bending moment of the $i^{th}$ element in a design configuration, $(EI)_i$ is the bending stiffness of the $i^{th}$ element, N is the total number of elements and U is the first element of the upper part of a design configuration.

31. The method of claim 23, wherein the transmitted strain energy index is defined by the equation:

$$PI = \frac{\left(\max_{i=U}^{N}(M_i) - \min_{i=U}^{N}(M_i)\right)^2}{16(EI)_N}$$

wherein PI is the transmitted strain energy index, i is the element index in a design configuration, $M_i$ is the bending moment of the $i^{th}$ element in a design configuration, $(EI)_N$ is the bending stiffness of each element in the upper part of a design configuration, N is the total number of elements and U is the first element of the upper part of a design configuration.

32. The method of claim 23, wherein the root-mean-square BHA sideforce index is defined by the equation:

$$PI = \sqrt{\frac{1}{C} \sum_{j=1}^{C} F_j^2}$$

wherein PI is the root-mean-square BHA sideforce index, j is the element index of the contact points between a design configuration and a modeled wellbore, C is the number of such contact points, and $F_j$ is the contact force.

33. The method of claim 23, wherein the total BHA sideforce index is defined by the equation:

$$PI = \sum_{j=1}^{C} |F_j|$$

wherein PI is the total BHA sideforce index, j is the element index of the contact points between a design configuration and a modeled wellbore, C is the number of such contact points, and $F_j$ is the contact force.

34. The method of claim 23, wherein the root-mean-square BHA torque index is defined by the equation:

$$PI = \sqrt{\frac{1}{C} \sum_{j=1}^{C} (\mu_j r_j F_j)^2}$$

wherein PI is the root-mean-square BHA torque index, j is the element index of the contact points between a design configuration and a modeled wellbore, C is the number of such contact points, $F_j$ is the contact force, $r_j$ is the radius to the contact point for the applied moment arm and $\mu_j$ is the appropriate coefficient of friction at each respective contact point.

35. The method of claim 23, wherein the total BHA torque index is defined by the equation:

$$PI = \sum_{j=1}^{C} |\mu_j r_j F_j|$$

wherein PI is the total BHA torque index, j is the element index of the contact points between a design configuration and a modeled wellbore, C is the number of such contact points, $F_j$ is the contact force, $r_j$ is the radius to the contact point for the applied moment arm and $\mu_j$ is the appropriate coefficient of friction at each respective contact point.

36. The method of claim 23 wherein the root-mean-square (RMS) average of the one or more performance indices is defined by the equation:

$$PI' = \sqrt{\frac{1}{mn} \sum_{i=1}^{m} \sum_{j=1}^{n} (PI)_{ij}^2}$$

wherein PI' is the RMS average of a selected performance index, j is an element index, i is an element index, m is the number of excitation modes, n is the number of BHA end-lengths, and $(PI)_{ij}$ is one of the one or more performance indices for the $i^{th}$ index of the m modes and $j^{th}$ index of the n BHA end-lengths in the BHA design configuration.

37. The method of claim 23 wherein the maximum of the one or more performance indices is defined by the equation:

$$PI' = \max_{i=1}^{m}\left\{\max_{j=1}^{n}(PI)_{ij}\right\}$$

wherein PI' is the maximum value of a selected performance index, j is an element index, i is an element index, m is the number of excitation modes, n is the number of BHA end-lengths, and $(PI)_{ij}$ is one of the one or more performance indices for the $i^{th}$ index of the m modes and $j^{th}$ index of the n BHA end-lengths in the BHA design configuration.

38. The method of claim 23 further comprising:
selecting at least one of the two or more design configurations based on the modeling of drilling equipment;
providing at least a portion of a selected bottom hole assembly design configuration;
drilling a wellbore to a subsurface formation with drilling equipment based on the selected bottom hole assembly design configuration;
disposing a wellbore completion into the wellbore; and
producing hydrocarbons from the subsurface formation.

39. A modeling system comprising:
a computer processor;
a memory coupled to the processor; and
a set of computer readable instructions accessible by the processor, wherein the set of computer readable instructions are configured to enable a process that comprises:

constructing two or more differing design configurations, wherein each of the design configurations represents at least a portion of a bottom hole assembly (BHA);
identifying operating parameters for the two or more differing design configurations;
selecting mathematical boundary conditions wherein the two or more differing design configurations are subjected to identical system excitation;
calculating results for each of the two or more differing design configurations using a lateral beam bending model that includes the identified operating parameters and the selected mathematical boundary conditions calculating results, for each of the two or more differing design configurations, one or more performance indices that characterize a determined BHA vibration performance of the two or more differing design configurations, wherein the one or more performance indices comprise at least one of an end-point curvature index, a BHA strain energy index, an average transmitted strain energy index, a transmitted strain energy index, a root-mean-square BHA sideforce index, a root-mean-square BHA torque index, a total BHA sideforce index, a total BHA torque index, and any mathematical combination thereof;
comparing the calculated results for the two or more differing design configurations; and
displaying the calculated results of at least one of the two or more differing design configurations.

40. The modeling system of claim 39 wherein the set of computer readable instructions is further configured to:
construct at least two design layouts;
associate common operating parameters and mathematical boundary conditions with each of the at least two design layouts; and
associate equipment parameters with each of the at least two design layouts to create each of the at least two differing design configurations;
simultaneously display the at least two differing design configurations.

41. The modeling system of claim 39 wherein the set of computer readable instructions is configured to display the calculated results as three dimensional responses.

42. The modeling system of claim 41 wherein the set of computer readable instructions is configured to rotate the three dimensional responses based on movement of one or more virtual slider bars.

43. The modeling system of claim 39 wherein the end-point curvature index is defined by the equation:

$$PI = \alpha \frac{M_n}{(EI)_N}$$

wherein PI is the end-point curvature index, $M_N$ is the bending moment at the last element in each of the design configurations, $(EI)_N$ is the bending stiffness of each such element, and $\alpha$ is a constant.

44. The modeling system of claim 39 wherein the BHA strain energy index is defined by the equation:

$$PI = \frac{1}{L} \sum_{i=1}^{L} \frac{M_i^2}{2(EI)_i}$$

wherein PI is the BHA strain energy index, L is the last element in a lower section of each of the design configurations, i is the element index in each of the design configurations, $M_i$ is the bending moment at the $i^{th}$ element in each of the design configurations, and $(EI)_i$ is the bending stiffness of this element.

45. The modeling system of claim 39 wherein the average transmitted strain energy index is defined by the equation:

$$PI = \frac{1}{(N-U+1)} \sum_{i=U}^{N} \frac{M_i^2}{2(EI)_i}$$

wherein PI is the average transmitted strain energy index, i is the element index in each of the design configurations, $M_i$ is the bending moment at the $i^{th}$ element in each of the design configurations, and $(EI)_i$ is the bending stiffness of each element, N is the total number of elements and U is the first element of the upper part of each of the design configurations.

46. The modeling system of claim 39 wherein the transmitted strain energy index is defined by the equation:

$$PI = \frac{\left(\max_{i=U}^{N}(M_i) - \min_{i=U}^{N}(M_i)\right)^2}{16(EI)_N}$$

wherein PI is the transmitted strain energy index, i is the element index in each of the design configurations, $M_i$ is the bending moment of the $i^{th}$ element in the design configurations, $(EI)_N$ is the bending stiffness of each element in the upper part of the design configurations, N is the total number of elements and U is the first element of the upper part of each of the design configurations.

47. The modeling system of claim 39, wherein the root-mean-square BHA sideforce index is defined by the equation:

$$PI = \sqrt{\frac{1}{C}\sum_{j=1}^{C} F_j^2}$$

wherein PI is the root-mean-square BHA sideforce index, j is the element index of the contact points between each of the design configurations and a modeled wellbore, C is the number of such contact points, and $F_j$ is the contact force calculated.

48. The modeling system of claim 39, wherein the total BHA sideforce index is defined by the equation:

$$PI = \sum_{j=1}^{C} |F_j|$$

wherein PI is the root-mean-square BHA sideforce index, j is the element index of the contact points between each of the design configurations and a modeled wellbore, C is the number of such contact points, and $F_j$ is the contact force calculated.

49. The modeling system of claim 39, wherein the root-mean-square BHA torque index is defined by the equation:

$$PI = \sqrt{\frac{1}{C}\sum_{j=1}^{C}(\mu_j r_j F_j)^2}$$

wherein PI is the root-mean-square BHA torque index, j is the element index of the contact points between each of the design configurations and a modeled wellbore, C is the number of such contact points, $F_j$ is the contact force, $r_j$ is the radius to the contact point for the applied moment arm and $\mu_j$ is the appropriate coefficient of friction at each respective contact point.

50. The modeling system of claim 39, wherein the total BHA torque index is defined by the equation:

$$PI = \sum_{j=1}^{C}|\mu_j r_j F_j|$$

wherein PI is the total BHA torque index, j is the element index of the contact points between each of the design configurations and a modeled wellbore, C is the number of such contact points, $F_j$ is the contact force, $r_j$ is the radius to the contact point for the applied moment arm and $\mu_j$ is the appropriate coefficient of friction at each respective contact point.

51. The modeling system of claim 39 wherein the root-mean-square (RMS) average of the one or more performance indices is defined by the equation:

$$PI' = \sqrt{\frac{1}{mn}\sum_{i=1}^{m}\sum_{j=1}^{n}(PI)_{ij}^2}$$

wherein PI' is the RMS average of a selected performance index, j is an element index, i is an element index, m is the number of excitation modes, n is the number of BHA end-lengths, and $(PI)_{ij}$ is one of the one or more performance indices for the $i^{th}$ index of the m modes and $j^{th}$ index of the n BHA end-lengths in each of the BHA design configurations.

52. The modeling system of claim 39 wherein the maximum of the one or more performance indices is defined by the equation:

$$PI' = \max_{i=1}^{m}\left\{\max_{j=1}^{n}(PI)_{ij}\right\}$$

wherein PI' is the maximum value of a selected performance index, j is an element index, i is an element index, m is the number of excitation modes, n is the number of BHA end-lengths, and $(PI)_{ij}$ is one of the one or more performance indices for the $i^{th}$ index of the m modes and index of the n BHA end-lengths in each of the BHA design configurations.

53. The method of claim 1 further comprising the steps of:
drilling at least a portion of a wellbore to a subsurface formation with drilling equipment using a bottom hole assembly design configuration based upon the calculated results; and
disposing a wellbore completion into the wellbore.

54. The method of claim 1 wherein the mathematical boundary condition has values of zero for the bit tilt angle, the moment at the bit, and the lateral displacement of the first contact above the bit, and wherein a constant magnitude lateral force is applied at the bit.

55. The method of claim 1 wherein the mathematical boundary condition has values of zero for the moment at the bit, the lateral displacement of the first contact above the bit, and the tilt angle of the first contact above the bit, and wherein a constant magnitude lateral force is applied at the bit.

56. The method of claim 23 further comprising the steps of:
drilling at least a portion of a wellbore to a subsurface formation with drilling equipment using a bottom hole assembly design configuration based upon the calculated results; and
disposing a wellbore completion into the wellbore.

57. The method of claim 23 wherein the mathematical boundary condition has values of zero for the bit tilt angle, the moment at the bit, and the lateral displacement of the first contact above the bit, and wherein a constant magnitude lateral force is applied at the bit.

58. The method of claim 23 wherein the mathematical boundary condition has values of zero for the moment at the bit, the lateral displacement of the first contact above the bit, and the tilt angle of the first contact above the bit, and wherein a constant magnitude lateral force is applied at the bit.

59. The method of claim 53 further comprising the step of producing hydrocarbons from the subsurface formation.

60. The method of claim 55 further comprising the step of producing hydrocarbons from the subsurface formation.

* * * * *